(12) United States Patent
Kunori et al.

(10) Patent No.: US 6,459,128 B1
(45) Date of Patent: Oct. 1, 2002

(54) FIELD-EFFECT TRANSISTOR

(75) Inventors: Shinji Kunori; Kousuke Ohshima, both of Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/521,666

(22) Filed: Mar. 8, 2000

(30) Foreign Application Priority Data

Oct. 13, 1999 (JP) .......................................... 11-290543
Dec. 24, 1999 (JP) .......................................... 11-367753

(51) Int. Cl.$^7$ ........................ H01L 29/94; H01L 31/113
(52) U.S. Cl. ........................ 257/368; 257/339; 257/341
(58) Field of Search ................................ 257/339, 341, 257/342, 335, 368; 438/206, 207, 212

(56) References Cited

U.S. PATENT DOCUMENTS

| | | | |
|---|---|---|---|
| 4,833,513 A | 5/1989 | Sasaki ........................ 357/23.4 |
| 4,972,240 A | * 11/1990 | Murakami et al. .......... 357/23.4 |
| 4,974,059 A | 11/1990 | Kinzer ........................ 357/23.4 |
| 5,399,892 A | 3/1995 | Neilson et al. .............. 257/341 |
| 5,408,118 A | * 4/1995 | Yamamoto ................... 257/342 |
| 5,621,234 A | * 4/1997 | Kato ........................... 257/339 |
| 5,686,750 A | * 11/1997 | Takahashi ................... 257/328 |
| 5,703,389 A | 12/1997 | Knoch et al. ............... 257/357 |
| 6,160,288 A | * 12/2000 | Yamada ....................... 257/330 |

FOREIGN PATENT DOCUMENTS

| | | |
|---|---|---|
| EP | 0 130 508 | 1/1985 |
| JP | 61-80859 | 4/1986 |
| JP | 61-290768 | 12/1986 |

OTHER PUBLICATIONS

Fujishima R Et Al: "High–performance lateral DMOSFET with oxide sidewall–spacers" Proceedings of the 6$^{th}$ International Symposium on Power Semiconductor Devices and ICS (ispsd) '94, DAVOS CH, May 31, 1994–Jun. 2, 1994, pp. 349–354, XP000505836 1994, Konstanz, Germany, Hartung–Gorre Verlag, Germany ISBN: 3–89191–784–8.

* cited by examiner

Primary Examiner—Steven Loke
Assistant Examiner—Douglas W. Owens
(74) Attorney, Agent, or Firm—Armstrong, Westerman & Hattori, LLP.

(57) ABSTRACT

A field-effect transistor has a plurality of cells. Each of the cells has a central node in the form of a circular portion of a base region, three branches in the form of rectangular portions of the base region and extending radially outwardly from the central node and angularly spaced at an angle of 120°, and circular portions of the base region which are connected to distal ends of the rectangular portions of the base region. The cells are uniformly arranged in an active region of a drain layer. The field-effect transistor has a small conduction resistance because the base region of each cell has a large peripheral length, has a smaller gate-to-drain capacitance than with polygonal cells, and has a high withstand voltage because the base region has no corners.

21 Claims, 24 Drawing Sheets

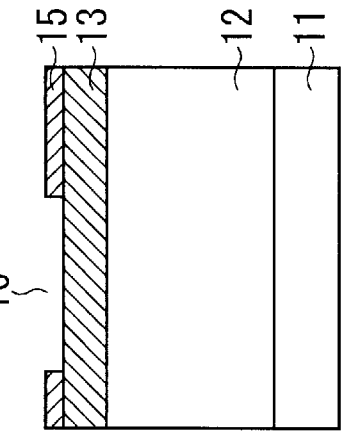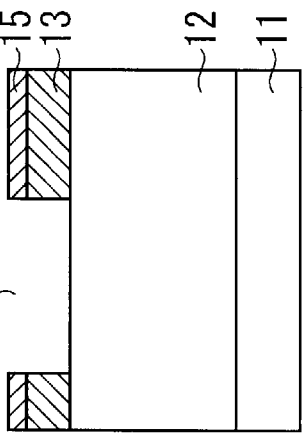
Fig. 3 (c)  Fig. 4 (c)
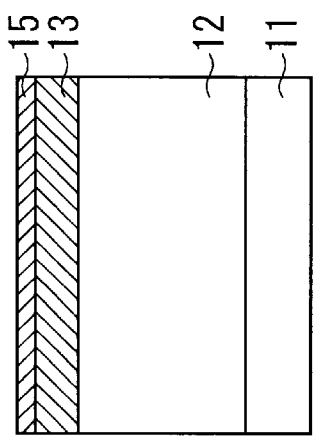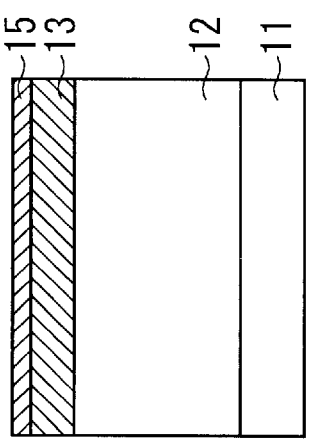
Fig. 3 (b)  Fig. 4 (b)
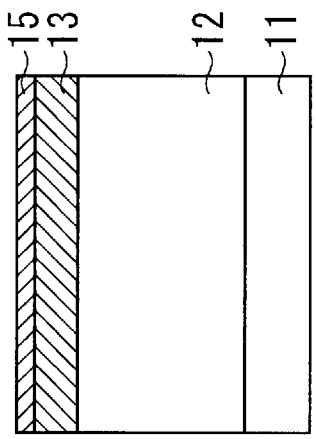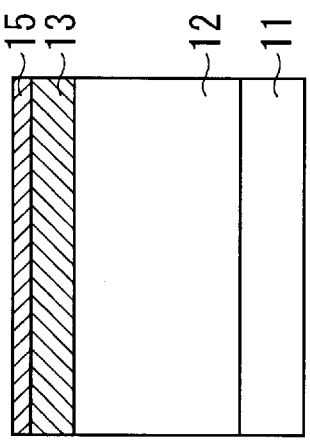
Fig. 3 (a)  Fig. 4 (a)

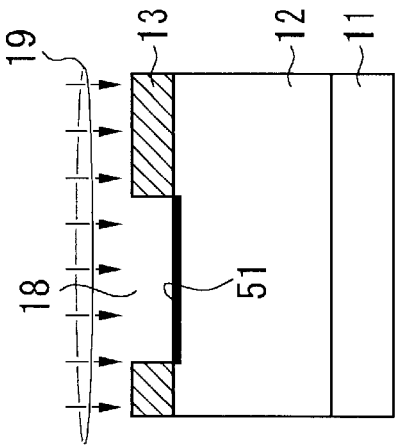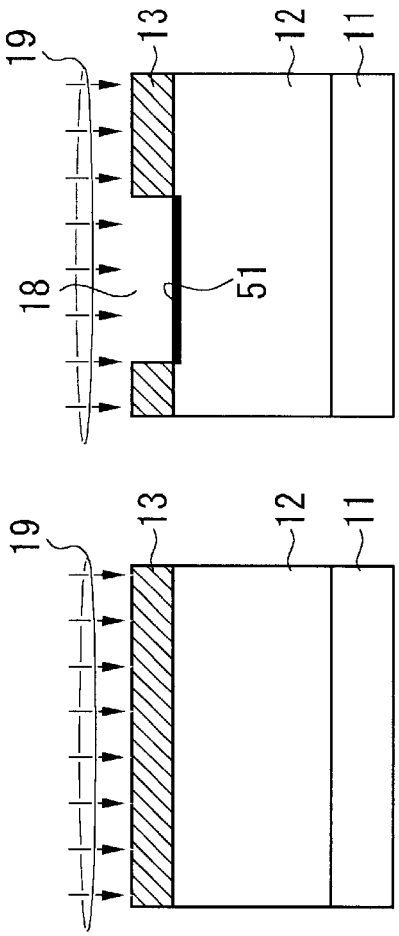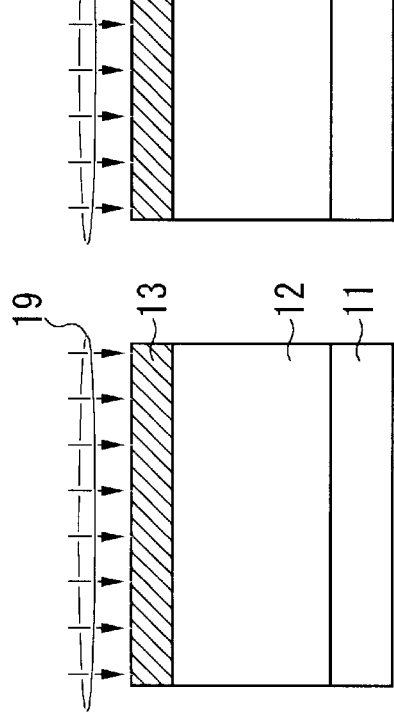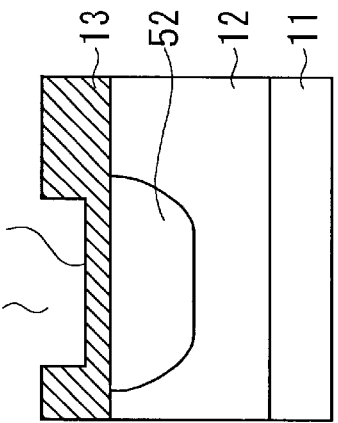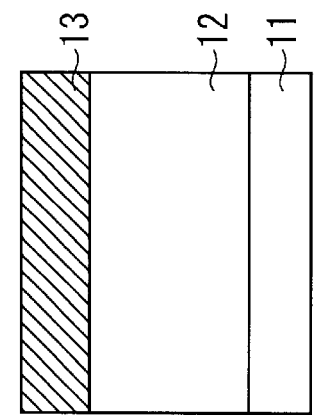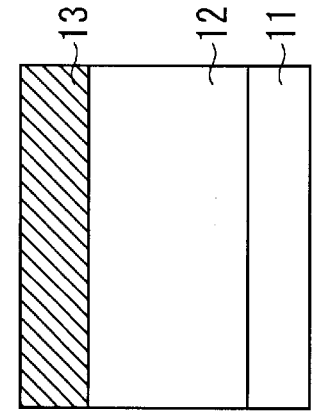

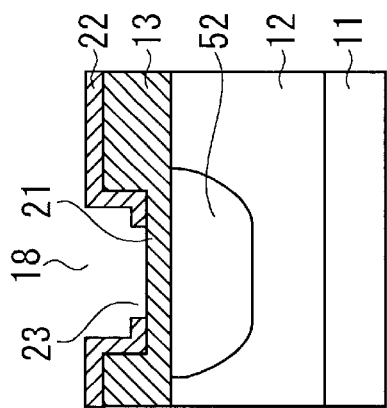
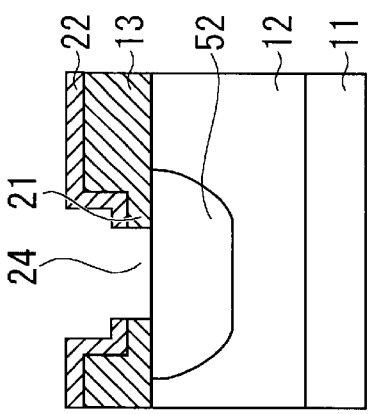
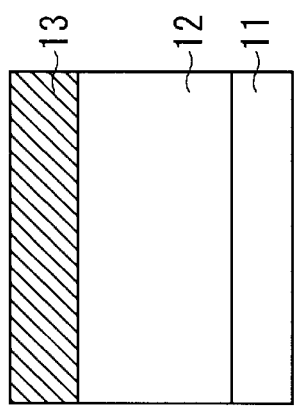
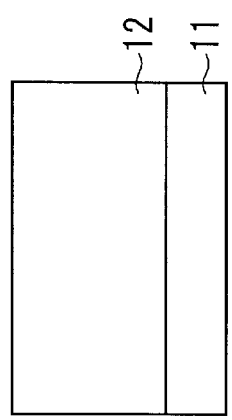
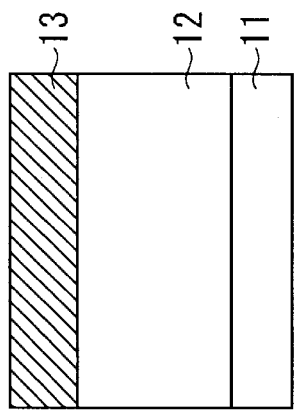
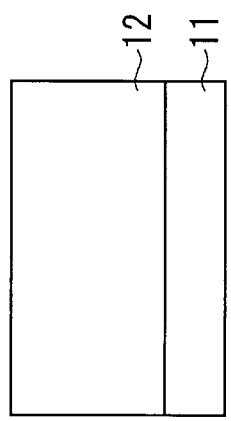

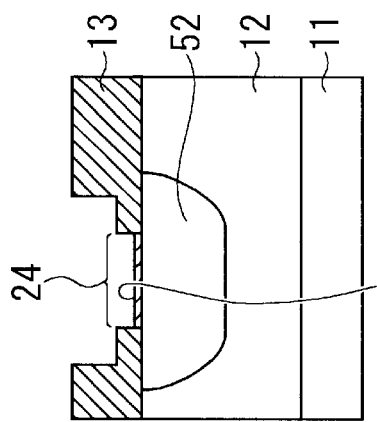
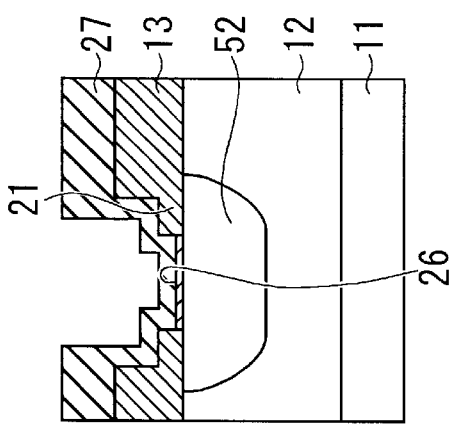
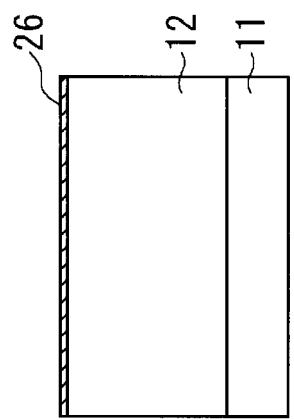
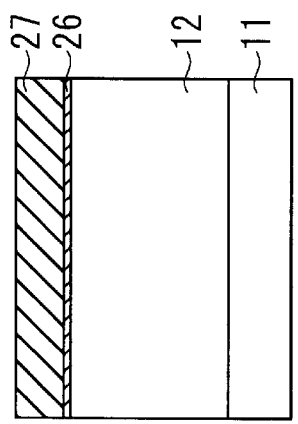
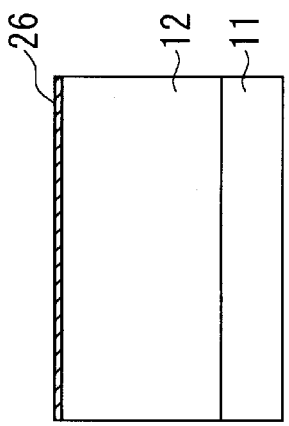
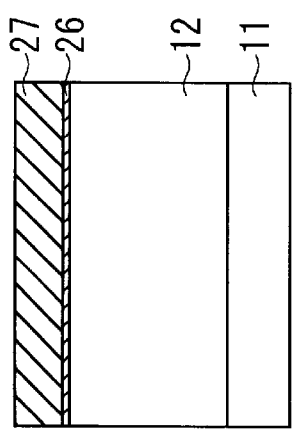

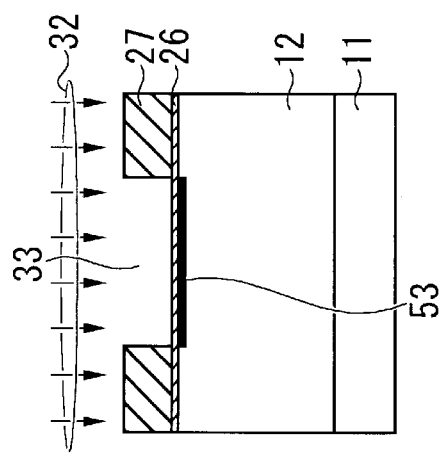
Fig.13 (a)
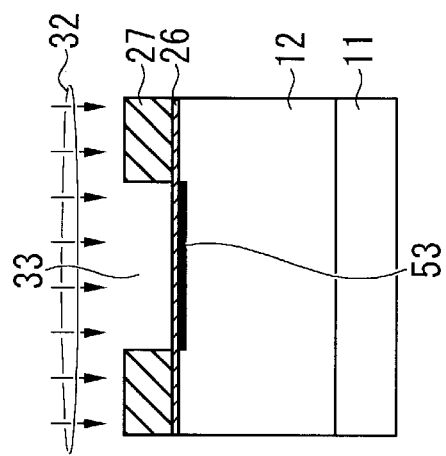
Fig.13 (b)
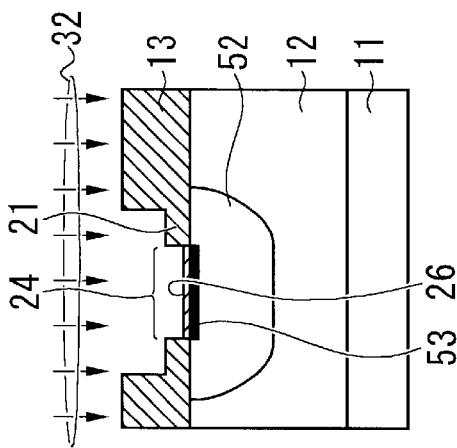
Fig.13(c)
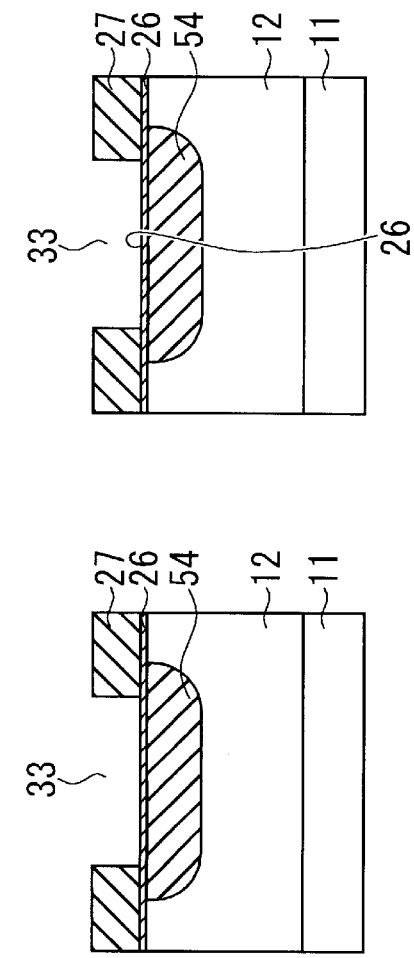
Fig.14(a)
Fig.14(b)
Fig.14(c)

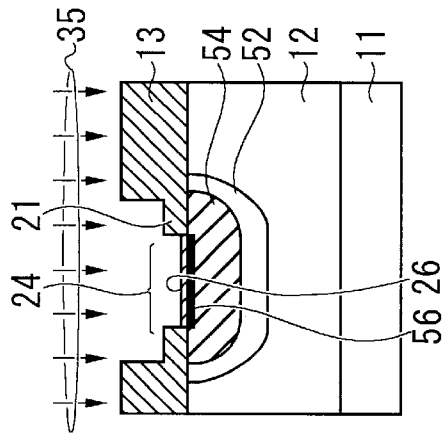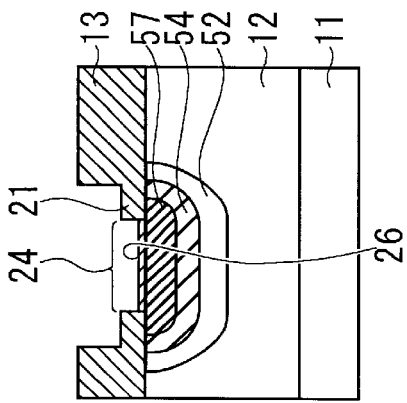
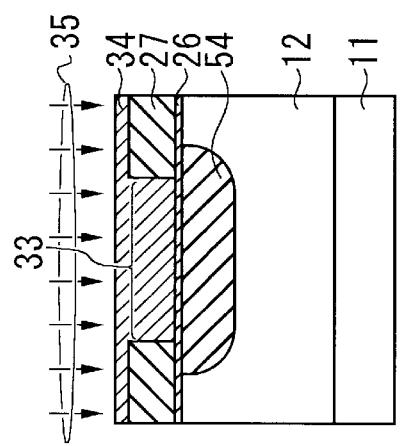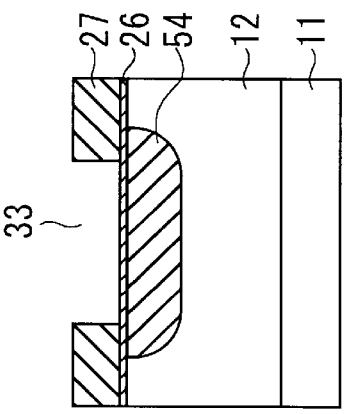
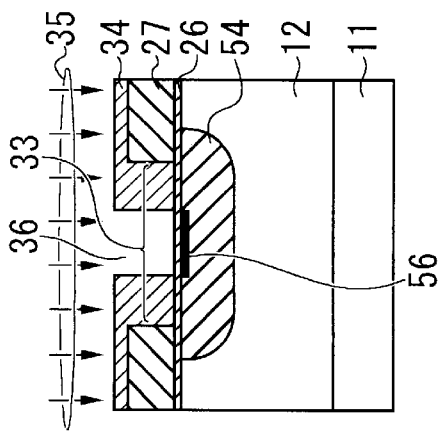
Fig.15(a)
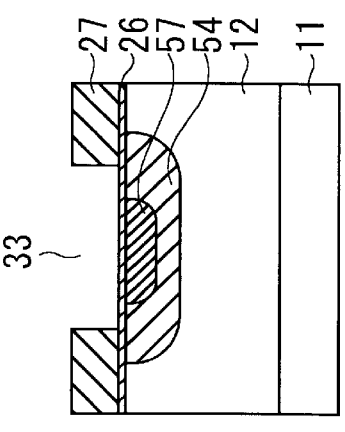
Fig.16(a)

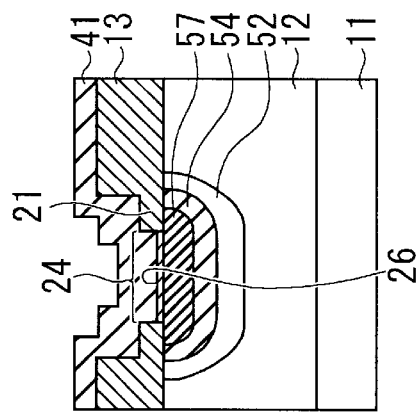
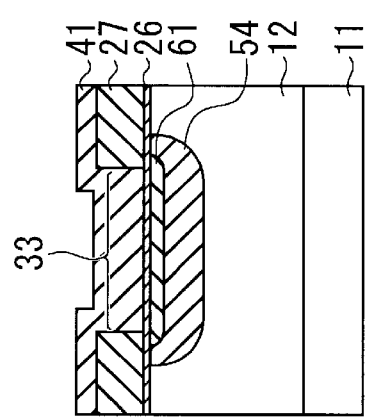
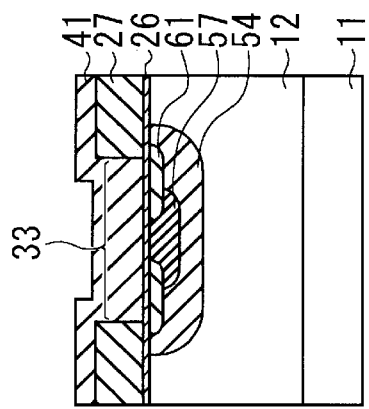
Fig.19 (a)
Fig.19 (b)
Fig.19 (c)
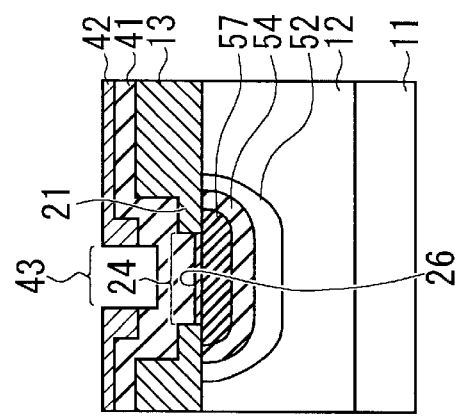
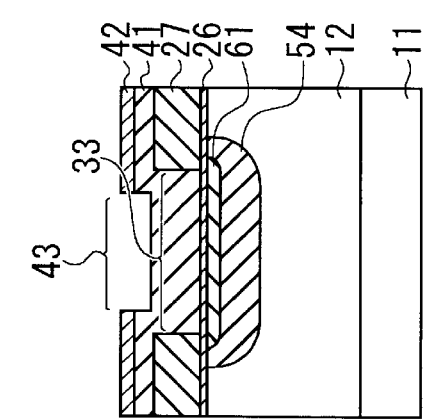
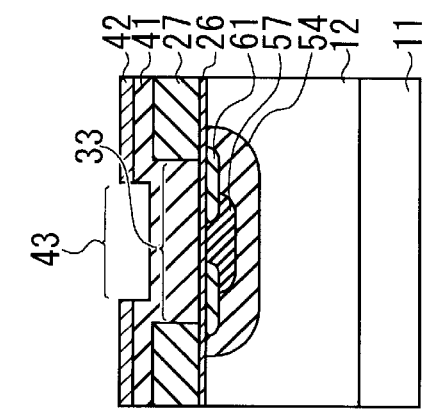
Fig.20 (a)
Fig.20 (b)
Fig.20 (c)

Fig.30
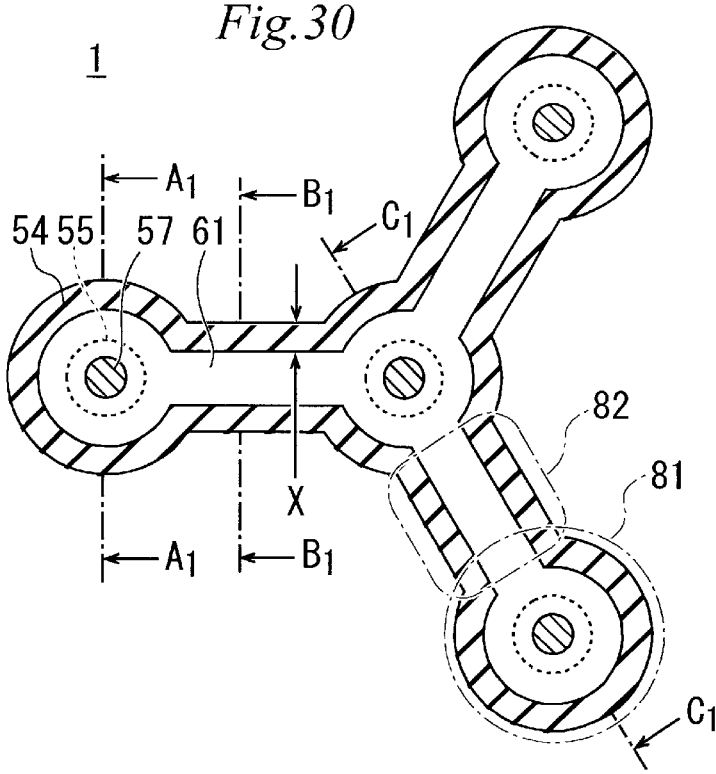
Fig.31
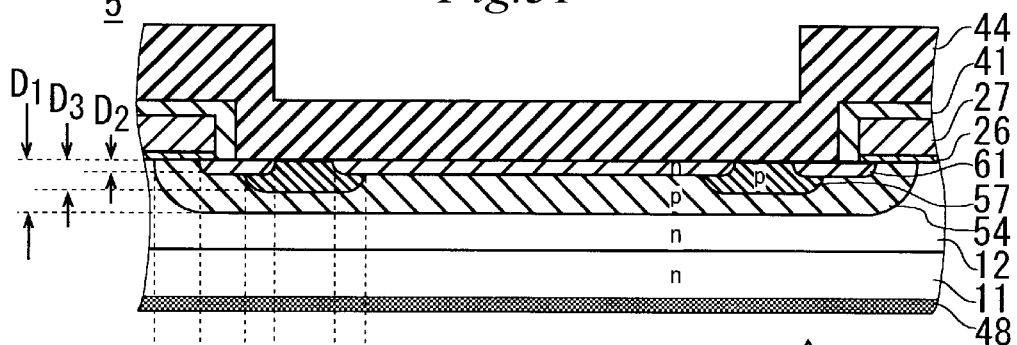
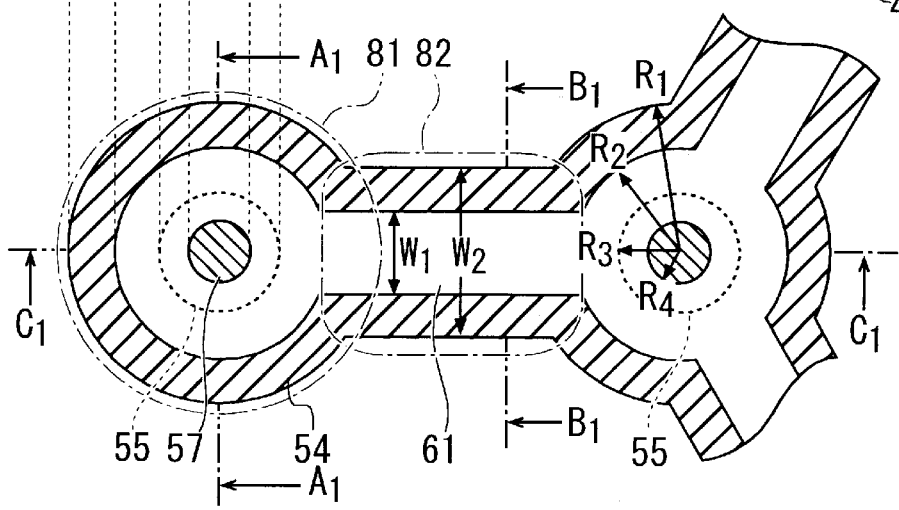

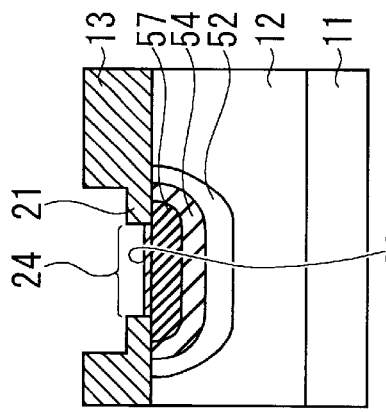
Fig.36 (c)
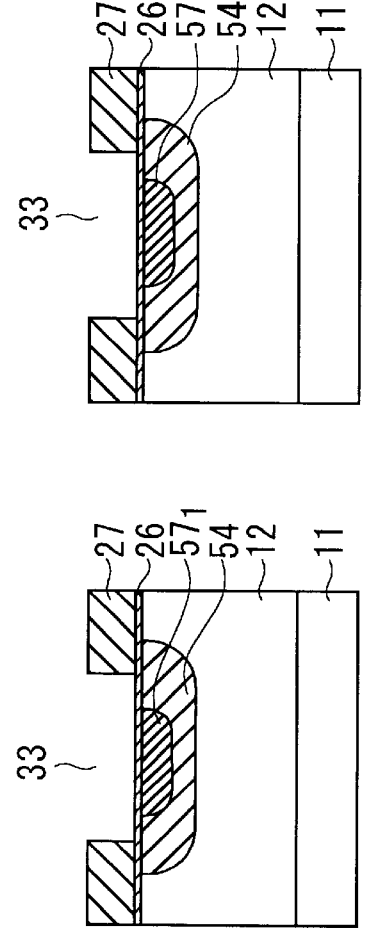
Fig.36 (b)
Fig.36 (a)
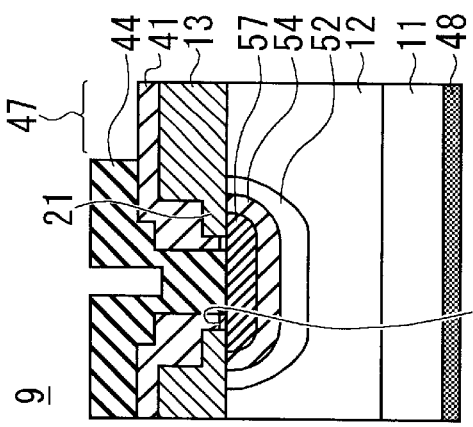
Fig.37 (c)
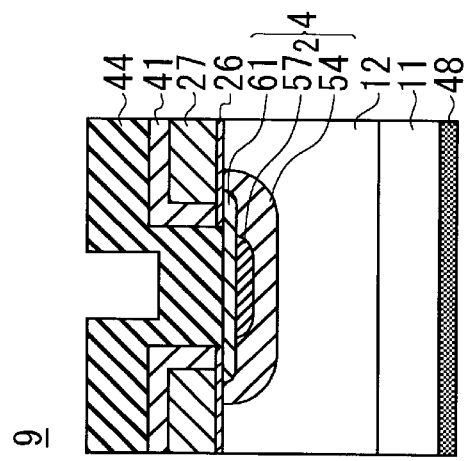
Fig.37 (b)
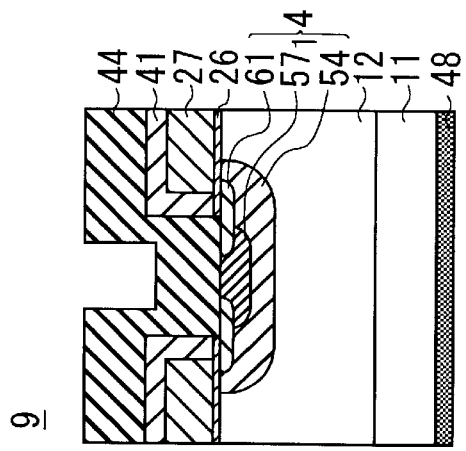
Fig.37 (a)

FIELD-EFFECT TRANSISTOR

BACKGROUND OF THE INVENTION

1. Field of the Invention

The present invention relates to the art of field-effect transistors, and more particularly to a field-effect transistor having a high breakdown voltage, a reduced gate-to-drain capacitance, and a low conduction resistance.

2. Description of the Related Art

MOS transistors with a number of cells have heretofore been employed as power control devices.

FIG. 40 of the accompanying drawings shows a conventional MOS transistor 105 by way of example. As shown in FIG. 40, the conventional MOS transistor 105 has a substrate 111 of single-crystal silicon and a drain layer 112 deposited on the substrate 111 by epitaxial growth.

The substrate 111 is doped with an N-type impurity at a high concentration, and the drain layer 112 is doped with an N-type impurity at a low concentration.

A P-type impurity is diffused into the drain layer 112 from its surface, forming base regions 154.

An N-type impurity is diffused into each of the base regions 154 from its surface, forming a ring-shaped source region 161. A region 110 represents a surface of each of the base regions 154 that is positioned between an end of the base region 154 and an outer periphery of the source region 161, and is referred to as a channel region. The channel region 110, the base region 154, and the source region 161 jointly make up a single cell 101. The MOS transistor 105 has a number of cells 101 arranged in a regular grid pattern on the surface of the drain layer 112.

FIG. 41 of the accompanying drawings shows the layout of the cells 101 of the MOS transistor 105.

In each of the cells 101, the surface of the base region 154 is exposed within the ring-shaped source region 161. A source electrode film 144 is disposed on the surface of the source region 161 and the surface of the base region 154 in each of the cells 101. The source region 161 and the base region 154 are connected to the source electrode film 144.

A gate insulating film 126 comprising a silicon oxide film is disposed on the channel region 110 in each cell 101 and the surface of the drain layer 112 between adjacent two cells 101. A gate electrode film 127 of polysilicon is disposed on the gate insulating film 126.

An interlayer insulating film 141 is disposed on the gate electrode film 127. The source electrode film 144 and the gate electrode film 127 on each of the cells 101 are insulated from each other by the interlayer insulating film 141. The source electrode films 144 on the respective cells 101 are interconnected by source electrode films 144 which are disposed on the interlayer insulating films 141.

A passivation film 150 is disposed on the source electrode films 144. The passivation film 150 and the interlayer insulating films 141 are patterned to have the source electrode 144 partially exposed on the MOS transistor 105. Metal films connected to the gate electrode films 127 are also partially exposed on the MOS transistor 105.

A drain electrode 148 is mounted on the surface of the substrate 111, i.e., the reverse side of the MOS transistor 105. The drain electrode 148, the exposed portions of the source electrode 144, and the exposed portions of the metal films connected to the gate electrode films 127 are connected to respective external terminals which are connected to an electric circuit for operating the MOS transistor 105.

For operating the MOS transistor 105, with the source electrode 144 placed in the ground potential and a positive voltage applied to the drain electrode 148, when a gate voltage (positive voltage) higher than a threshold voltage is applied to the gate electrode films 127, an N-type inverted layer is formed on the surface of the P-type channel region 110 and interconnects the source region 161 and the drain layer 112, causing a current to flow from the drain electrode 148 to the source electrode 144.

When a voltage (e.g., the ground potential) lower than the threshold voltage is applied to the gate electrode films 127, the inverted layer is eliminated, reversely biasing the base region 154 and the drain layer 112. Therefore, no current flows between the drain electrode 148 and the source electrode 144.

The current path between the drain electrode 148 and the source electrode 144 can be rendered conductive and non-conductive when the voltage applied to the gate electrode films 127 is controlled. Therefore, the MOS transistor 105 is widely used as a high-speed switch in power supply circuits and electric circuits of high power requirements such as motor control circuits.

The conduction resistance of the MOS transistor 105 while it is being conductive is smaller as the sum of the widths of the channel regions of the cells 101 is larger. Stated otherwise, the greater the sum of the peripheral lengths of the base regions 154 and the source regions 161, the better the MOS transistor 105. For this reason, there have been proposed cells of various shapes including the illustrated square-shaped cells 101, comb-shaped cells, and polygonally shaped cells.

The withstand voltage of the MOS transistor 105 is lowest at the spherical junctions at the four corners of each of the cells 101. Thus, corner-free circular cells have been proposed in order to increase the withstand voltage and the breakdown voltage.

However, while circular cells provide a withstand voltage closer to the withstand voltage of cylindrical junctions than the withstand voltage of spherical junctions, the circular cells pose a problem in that the conduction resistance of the MOS transistor increases because of reduced peripheral lengths of the base regions 154 and the source regions 161 even if the circular cells are arranged in the same pattern as other cells.

SUMMARY OF THE INVENTION

It is therefore an object of the present invention to provide a field-effect transistor having a high withstand voltage, a reduced capacitance, and a low conduction resistance.

To achieve the above object, there is provided in accordance with the present invention a field-effect transistor comprising a drain layer being disposed on a surface of substrate, a plurality of base regions having a conductivity type which is opposite to the conductivity type of the drain layer, the base regions being disposed in a surface of the drain layer in an active region, a source region having a conductivity type which is the same as the conductivity type of the drain layer, and at least one source region being disposed in the base regions in surfaces thereof respectively, the base regions having respective outer peripheries spaced from outer peripheries of the source regions disposed respectively in the base regions, the base regions having portions positioned between the outer peripheries of the base regions and the outer peripheries of the source regions, the portions serving as channel regions, respectively, a gate insulating film disposed on a surface of each of the channel regions, and a gate electrode film disposed on a surface of the gate insulating film, the arrangement being such that when a voltage of a predetermined polarity is applied to the gate electrode film to invert the surface of each of the channel regions into a polarity opposite to the base regions, the source regions and the drain layer are connected to each other by the inverted surface of each of the channel regions, each of the base regions having at least one rectangular branch and at least two circular nodes, the base region of the nodes having ends connected to opposite ends of the base region of the branch, the source region in the branch and the source region in the nodes being connected to each other.

The field-effect transistor relating to the present invention, further comprising a plurality of ohmic regions disposed respectively in the base regions, the ohmic regions having a conductivity type which is the same as the conductivity type of the base regions and having a concentration higher than the concentration of the base regions, the ohmic regions and the source regions being connected to a source electrode film.

The field-effect transistor relating to the present invention, wherein the source regions in the nodes have ring-shaped portions, the ohmic regions being disposed centrally in the ring-shaped.

The field-effect transistor relating to the present invention, wherein the ohmic regions of the branch being disposed underneath the source regions of the branch and connecting to the ohmic regions of said nodes.

Each of the base regions has four nodes and three branches, the branches extending radially outwardly from a central one of the nodes, and the other nodes being connected respectively to distal ends of the branches.

The branches are angularly spaced from each other at an angle of about 120° and connected to the central one of the nodes.

The field-effect transistor relating to the present invention, wherein each of the base regions has the two nodes and the branch being arranged on a straight line, with the nodes connected to both ends of the branch.

Each of the base regions has a plurality of the nodes and a number of branches which are fewer than the nodes by 1, the branches being arranged on a straight line, with each of the nodes being positioned between adjacent two of the branches.

The field-effect transistor further comprises a substrate having a conductivity type which is the same as the conductivity type of the drain layer, and an electrode disposed on a reverse side of the drain layer being disposed on the substrate.

The further comprises a substrate having a conductivity type which is opposite to the conductivity type of the drain layer, and an electrode disposed on a reverse side of the drain layer being disposed on the substrate.

The integrated circuit device having field-effect transistor further comprises a substrate having a conductivity type which is opposite to the conductivity type of the drain layer, the drain layer being disposed on a surface of the substrate, the drain layer having an integrated circuit region having at least a transistor formed therein and the active region, a separating region surrounding the active region and having a conductivity type which is the same as the conductivity type of the substrate, a p-n junction separating the active region from the integrated circuit region, a drain electrode film being disposed in the surface of the drain layer in the active region, and the drain electrode film being separated electrically from the source region.

The field-effect transistor according to the present invention has a plurality of cells disposed in a drain layer and each having at least a base region and a source region. Each of the cells has at least one rectangular branch and circular nodes.

The base region in each of the circular nodes and the base region in the branch are connected to each other by superposed ends thereof. Since the base region in the circular nodes is connected to opposite ends of the base region in the rectangular branch, if the diameter of the base region in the nodes is larger than the width of the base region in the rectangular branch, then no sharp corner occurs in the base region, and the withstand voltage of the field-effect transistor increases to a value close to the withstand voltage which would be achieved by cylindrical junctions.

If each cell has three branches extending radially outwardly from a central node and nodes connected to distal ends of the branches, then an increased number of cells can be disposed in the drain layer. Therefore, the field-effect transistor has a reduced conduction resistance and a reduced input capacitance.

Currents in each of the cells are uniformly distributed if the branches are angularly spaced at 120°.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 3(a) through 3(c) are cross-sectional views illustrative of a step of fabricating the field-effect transistor according to the present invention;

FIGS. 4(a) through 4(c) are cross-sectional views illustrative of a step of fabricating the field-effect transistor according to the present invention;

FIGS. 5(a) through 5(c) are cross-sectional views illustrative of a step of fabricating the field-effect transistor according to the present invention;

FIGS. 6(a) through 6(c) are cross-sectional views illustrative of a step of fabricating the field-effect transistor according to the present invention;

FIGS. 7(a) through 7(c) are cross-sectional views illustrative of a step of fabricating the field-effect transistor according to the present invention;

FIGS. 8(a) through 8(c) are cross-sectional views illustrative of a step of fabricating the field-effect transistor according to the present invention;

FIGS. 9(a) through 9(c) are cross-sectional views illustrative of a step of fabricating the field-effect transistor according to the present invention;

FIGS. 10(a) through 10(c) are cross-sectional views illustrative of a step of fabricating the field-effect transistor according to the present invention;

FIGS. 13(a) through 13(c) are cross-sectional views illustrative of a step of fabricating the field-effect transistor according to the present invention;

FIGS. 14(a) through 14(c) are cross-sectional views illustrative of a step of fabricating the field-effect transistor according to the present invention;

FIGS. 15(a) through 15(c) are cross-sectional views illustrative of a step of fabricating the field-effect transistor according to the present invention;

FIGS. 16(a) through 16(c) are cross-sectional views illustrative of a step of fabricating the field-effect transistor according to the present invention;

FIGS. 19(a) through 19(c) are cross-sectional views illustrative of a step of fabricating the field-effect transistor according to the present invention;

FIGS. 20(a) through 20(c) are cross-sectional views illustrative of a step of fabricating the field-effect transistor according to the present invention;

FIG. 30 is a plan view of a cell for use in the field-effect transistor according to the present invention;

FIG. 31 is set of a cross-sectional view of the cell for use in the field-effect transistor according to the present invention, and a plan view corresponding to the cross-sectional view;

FIGS. 36(a) through 36(c) are cross-sectional views illustrative of a step of fabricating the field-effect transistor having the example 4 of cell according to the present invention;

FIGS. 37(a) through 37(c) are cross-sectional views illustrative of a step of fabricating the field-effect transistor having the example 4 of cell according to the present invention;

DETAILED DESCRIPTION OF THE PREFERRED EMBODIMENTS

Figure 27:
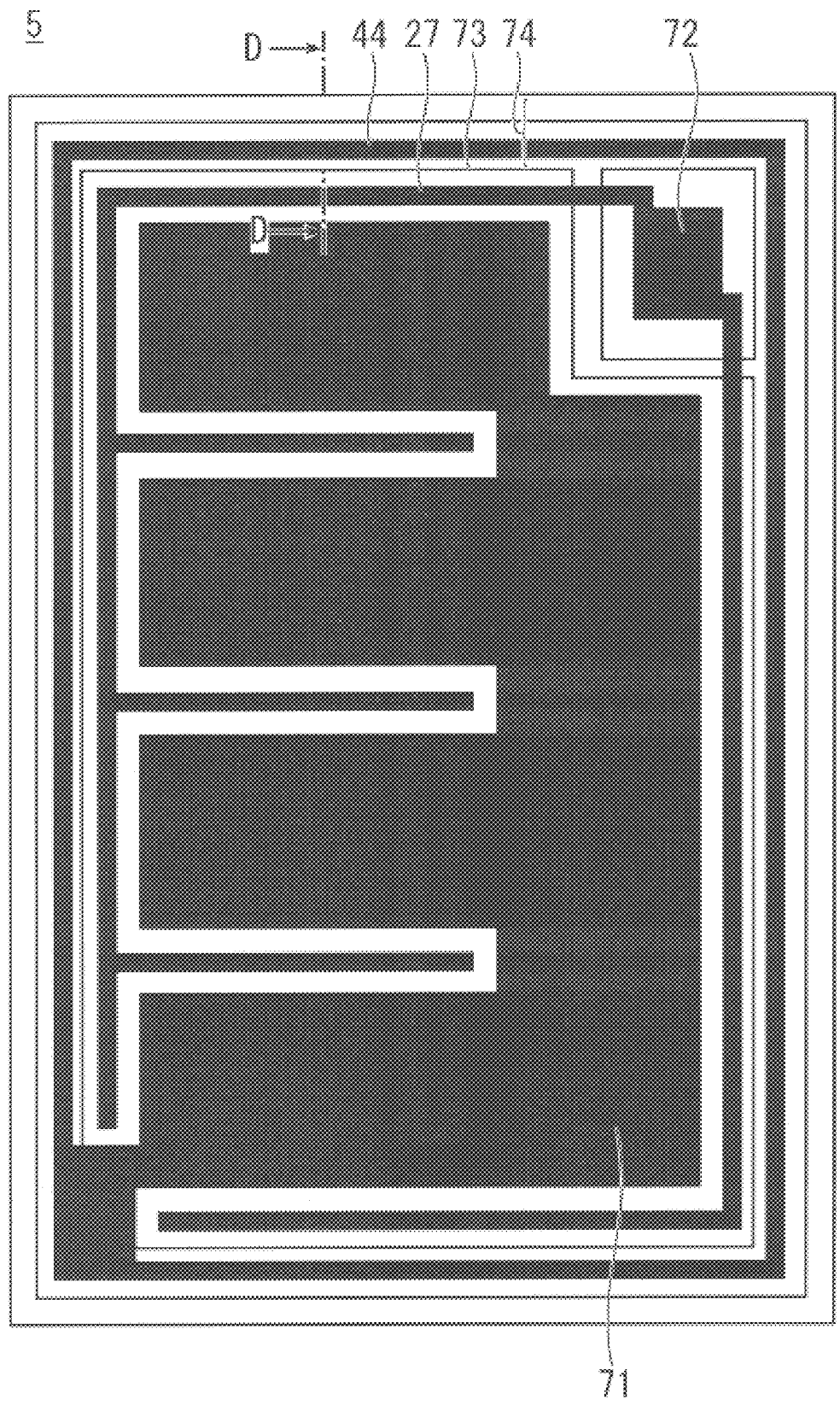
FIG. 27 is a plan view of a field-effect transistor according to the present invention.

FIG. 27 shows a MOS transistor 5 according to the present invention which has a number of cells disposed in a drain layer deposited on a substrate of single-crystal silicon by epitaxial growth. The MOS transistor 5 includes a source electrode film 44 and a gate electrode film 27 which are connected to each of the cells and also connected respectively to a source electrode pad 71 and a gate electrode pad 72.

The gate electrode pad 72 has its surface covered with a thin metal film of the source electrode film 44. The source electrode pad 71 and the gate electrode pad 72 can be connected to external terminals by wire bonding or the like.

A drain electrode (described later on) is disposed on the reverse side of the substrate of single-crystal silicon, and can be connected to the surface of a lead frame or the like.

Figure 28:
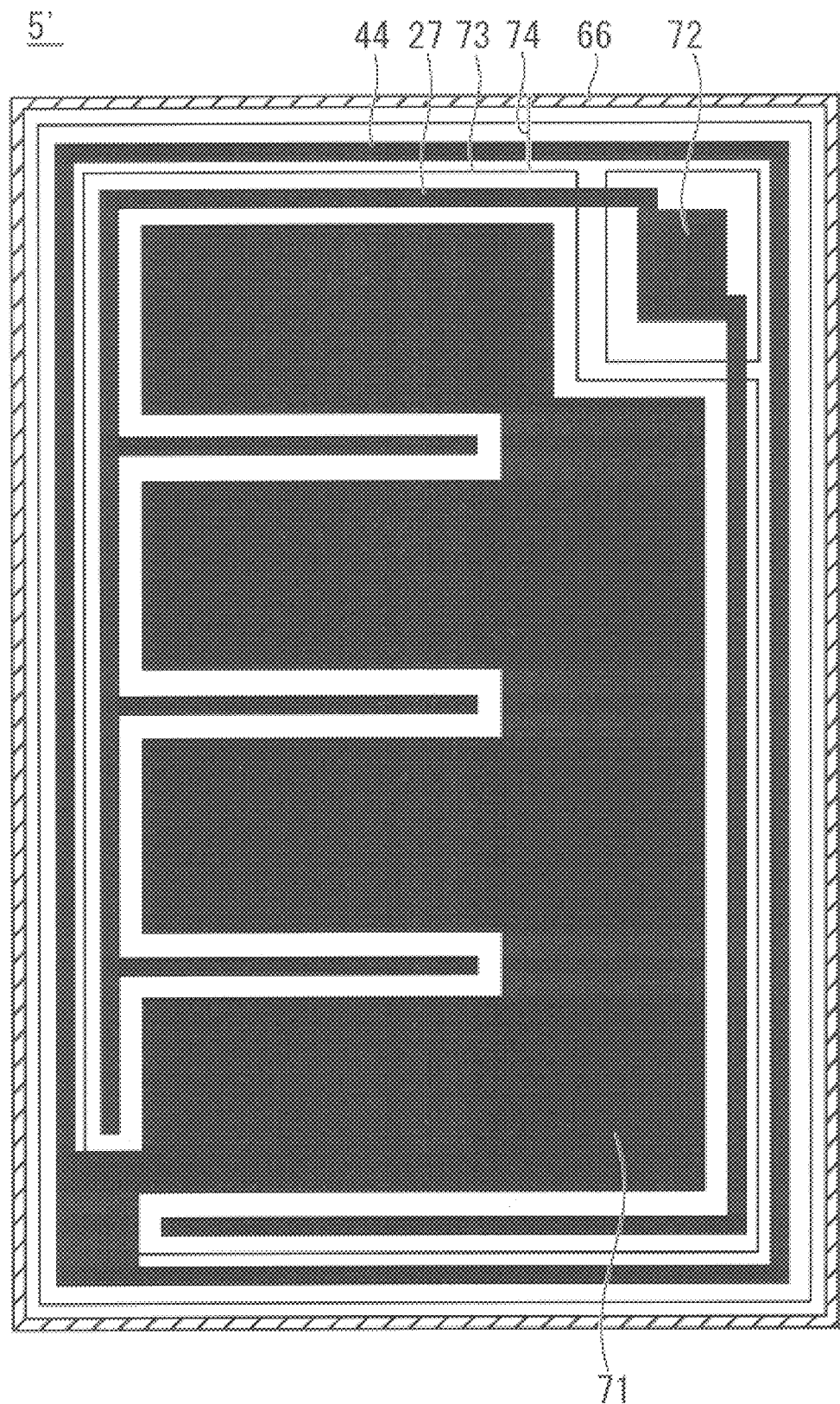
FIG. 28 is a plan view of another field-effect transistor according to the present invention.

The MOS transistor 5 has an active region 73 positioned beneath the source electrode pad 71 as shown in FIG. 28. The active region 73 is surrounded by a peripheral region 74 disposed therearound for increasing the withstand voltage of the MOS transistor 5.

Figure 29:
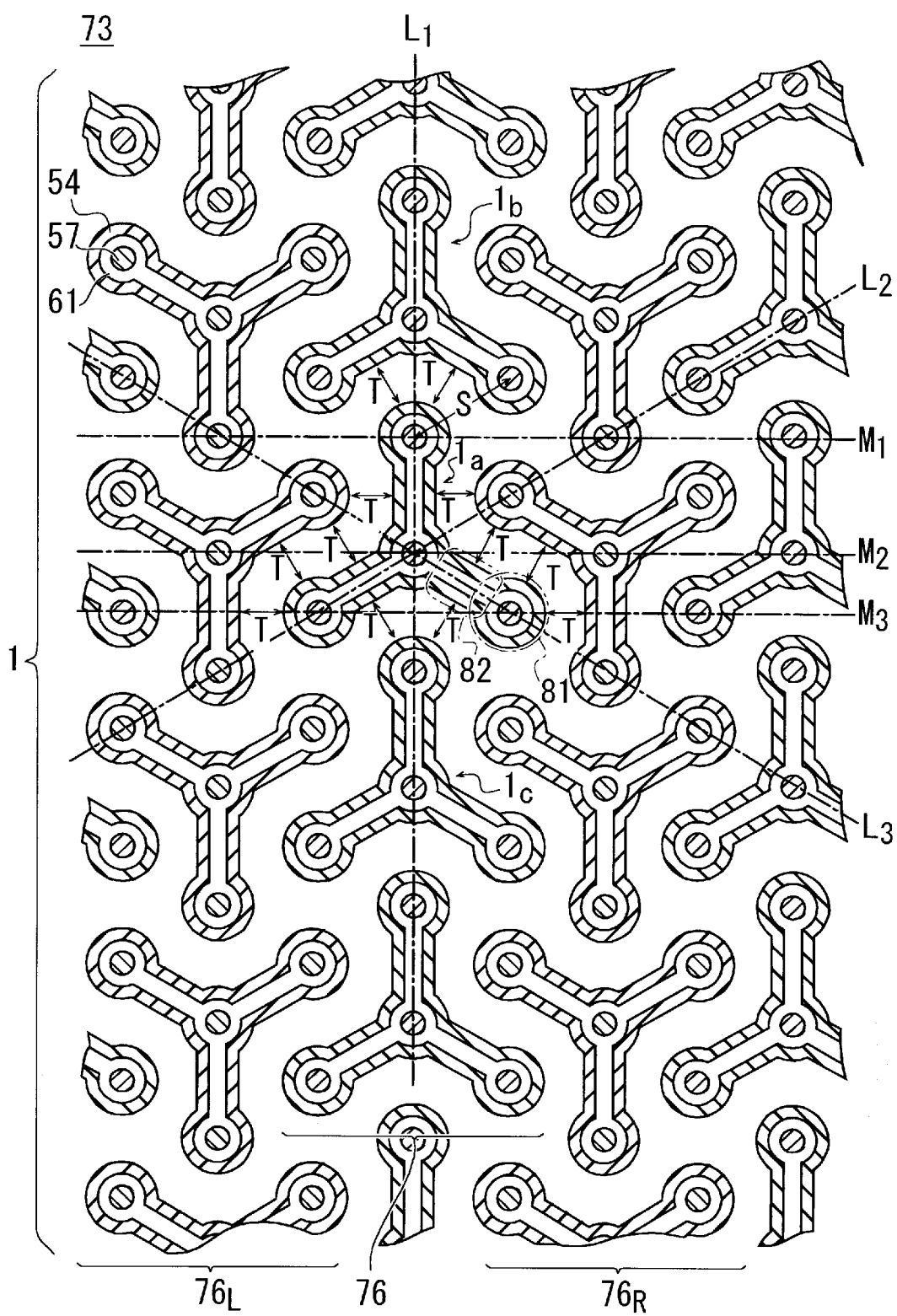
FIG. 29 is a plan view showing a layout of cells of the field-effect transistor according to the present invention.

FIG. 29 shows in fragmentary plan the active region 73 with thin films such as an oxide film and a gate electrode film (described later on) being omitted from illustration. A number of cells 1 are formed in the active region 73.

FIG. 30 shows one of the cells 1 at an enlarged scale in plan. The cell 1 is also shown fragmentarily at an enlarged scale in FIG. 31. The cell 1 and the thin films are also shown in fragmentary cross section in FIG. 31.

The cross-sectional view in an upper area of FIG. 31 is taken along line $C_1$—$C_1$ in a lower area of FIG. 31.

The cell 1 is formed in a drain layer comprising an n-type epitaxial layer and has a p-type base region 54 and an n-type source region 61 disposed in the p-type base region 54. Each of the base region 54 and the source region 61 comprises circular portions and rectangular portions.

In FIGS. 30 and 31, the circular portions comprise nodes 81 and the rectangular portions comprise branches 82. The cell 1 has four nodes 81 and three branches 82.

The three branches 82 extend radially outwardly from a central one of the nodes 81, and the remaining three nodes 81 are positioned respectively at the radially outer ends of the three branches 82.

A substantially regular triangle is formed by lines interconnecting the centers of the three outer nodes 81. The regular triangle has its center substantially aligned with the center of the central node 81. The branches 82 are positioned respectively on the lines interconnecting the vertexes and center of the regular triangle, and have respective central axes aligned respectively with those lines of the regular triangle.

The base region 54 in the nodes 81 and the base region 54 in the branches 82 are connected to each other. The rectangular portions of the base regions 54 in the branches 82 have ends connected to the circumferential edge of the circular portion of the base region 54 in the central node 81.

The circular portions of the base region 54 in the outer nodes 81 are connected to the opposite ends of the rectangular portions of the base regions 54 in the branches 82. Therefore, a single cell 1 contains a continuous base region 54.

The source region 61 is disposed within the base region 54 inwardly of the outer periphery thereof. The source region 61 has an outer periphery spaced from the outer periphery of the base region 54 by a distance indicated by X in FIG. 30. The base region 54 lying between the outer periphery of the source region 61 and the outer periphery of the base region 54 serves as a channel region. A gate insulating film 26 and a gate electrode film 27 (described later on) are disposed on the channel region. When a positive voltage is applied to the gate electrode film 27, the surface of the base region 54 in the channel region is inverted into an n-type region.

The circular portions of the source region 61 in the nodes 81 are ring-shaped, with p-type ohmic regions 57 disposed centrally therein. The source region 61 is shallower than the base region 54 and the ohmic regions 57, and the ohmic regions 57 have outer peripheries extending underneath the source region 61.

The surface concentration of the ohmic regions 57 is higher than the surface concentration of the base region 54. The ohmic regions 57 are connected to the source electrode film 44, which may comprise a thin aluminum film or the like, by ohmic contact.

A process of fabricating the MOS transistor 5 with the cells 1 will be described below.

FIGS. 1(a)–1(c) through 25(a)–25(c) are illustrative of steps of the process of fabricating the MOS transistor 5. FIGS. 1(a) through 25(a) are cross-sectional views taken along line $A_1$—$A_1$ of FIGS. 30 and 31. FIGS. 1(b) through 25(b) are cross-sectional views taken along line $B_1$—$B_1$ of FIGS. 30 and 31. FIGS. 1(c) through 25(c) are cross-sectional views of the peripheral region 74, corresponding to a cross-sectional view taken along line $D_1$—$D_1$ of FIG. 27.

In FIGS. 1(a)–1(c), an n⁻-type drain layer 12 of silicon is deposited on the surface of a substrate 11 of n⁺-type single-crystal silicon by epitaxial growth.

As shown in FIGS. 2(a)–2(c), a silicon oxide film 13 is formed on the surface of the drain layer 12 by a thermal oxidation process. In FIGS. 2(a)–2(c) through 25(a)–25(c), a thin film such as a silicon oxide film deposited on the reverse side of the substrate 11 remote from the drain layer 12 is omitted from illustration.

After the silicon oxide film 13 is formed, a patterned resist film 15 is formed on the surface of the silicon oxide film 13 by a photoresist process, as shown in FIGS. 3(a) through 3(c). At this time, a portion of the surface of the silicon oxide film 13 over the cell 1 is covered with the resist film 15, as shown in FIGS. 3(a) and 3(b), and an opening 16 is defined in the resist film 15 over the peripheral region, as shown in FIG. 3(c).

When the assembly is etched, the silicon oxide film 13 exposed at the bottom of the opening 16 is removed in the peripheral region, producing an opening 18, which is identical in shape to the opening 16, in the silicon oxide film 13 in the peripheral region, as shown in FIG. 4(c). The active region remains unchanged, as shown in FIGS. 4(a) and 4(b).

Then, the resist film 15 is removed, as shown in FIGS. 5(a) through 5(c). When boron ions 19 are applied to the surface of the silicon oxide film 13, the boron ions 19 are injected into the surface of the drain layer 12 which is exposed at the bottom of the opening 18. The injected boron ions 19 produce a p-type high-concentration region 51 near the surface of the drain layer 12, as shown in FIG. 5(c). In the active region, the boron ions 19 are not injected into the drain layer 12 because the drain layer 12 is masked by the silicon oxide film 13, as shown in FIGS. 5(a) and 5(b).

Then, the assembly is heated to diffuse the high-concentration region 51 into a p-type well region 52 in the drain layer 12, and form a thin silicon oxide film 21 on the surface of the drain layer 12 at the bottom of the opening 18, as shown in FIG. 6(c). At this time, the active region remains essentially the same except that the thickness of the silicon oxide film 13 increases, and no well region 52 is formed in the active region, as shown in FIGS. 6(a) and 6(b). The well region 52 is ring-shaped as viewed in plan, with the active region disposed in the ring-shaped well region 52.

Then, a patterned resist film 22 is formed on the surfaces of the silicon oxide films 13, 21, as shown in FIGS. 7(a)–7(c). At this time, the resist film 22 is not disposed, exposing the silicon oxide film 13, in the active region, as shown in FIGS. 7(a) and 7(b), and the resist film 22 which has an opening 23 therein is disposed on the silicon oxide films 13, 21 in the peripheral region, as shown in FIG. 7(c).

The opening 23 is disposed over the well region 52, with the thin silicon oxide film 21 partly exposed at the bottom of the opening 23.

When the assembly is then etched, the silicon oxide film 21 is partly removed in the peripheral region, forming an opening 24. The surface of the well region 52 is exposed at the bottom of the opening 24, as shown in FIG. 8(c).

In the active region, the silicon oxide film 13 is removed, exposing the surface of the drain layer 12, as shown in FIGS. 8(a) and 8(b).

After the removal of the resist film 22, the assembly is thermally oxidized to form a gate insulating film 26 comprising a silicon oxide film on the surface of the drain layer 12 exposed in the active region, as shown in FIGS. 9(a) and 9(b). In the peripheral region, the gate insulating film 26 is formed on the surface of the well region 52 exposed at the bottom of the opening 24, as shown in FIG. 9(c).

Then, a gate electrode film 27 of polysilicon is deposited on the entire surface of the assembly, as shown in FIGS. 10(a)–10(c). With the gate electrode film 27 exposed in the peripheral region, a patterned resist film 28 is formed on the surface of the gate electrode film 27 in the active region, as shown in FIGS. 11(a)–11(c). The resist film 28 has a plurality of openings 30 arranged in a regular pattern, with the surface of the gate electrode film 27 exposed at the bottom of the openings 30.

Figure 1:
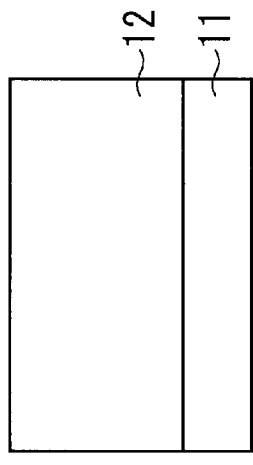
FIGS. 1(a) through 1(c) are cross-sectional views illustrative of a step of fabricating a field-effect transistor according to the present invention.
Figure 1:
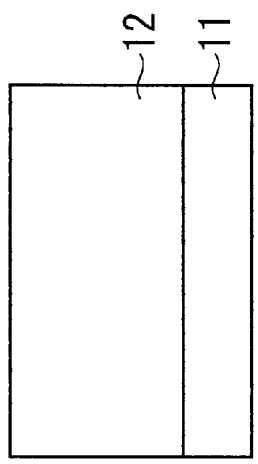
Figure 1:
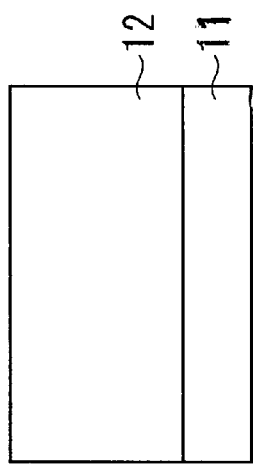
Figure 2:
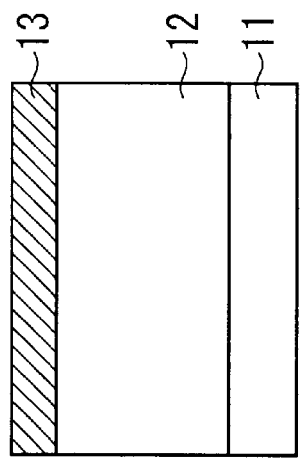
FIGS. 2(a) through 2(c) are cross-sectional views illustrative of a step of fabricating the field-effect transistor according to the present invention.
Figure 2:
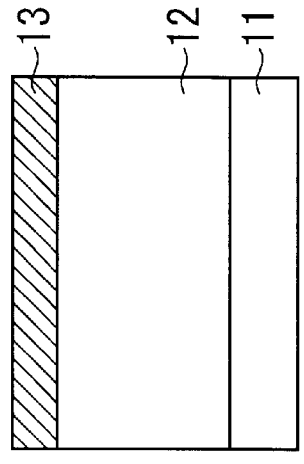
Figure 2:
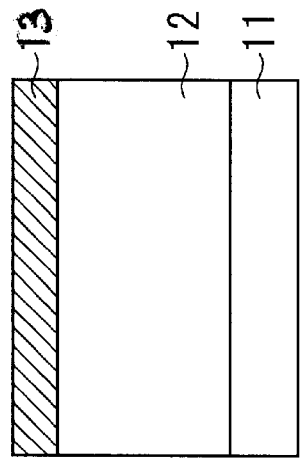
Figure 11:
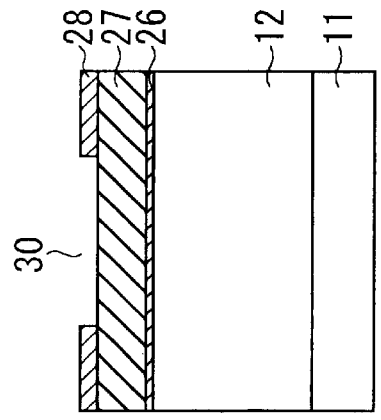
FIGS. 11(a) through 11(c) are cross-sectional views illustrative of a step of fabricating the field-effect transistor according to the present invention.
Figure 12:
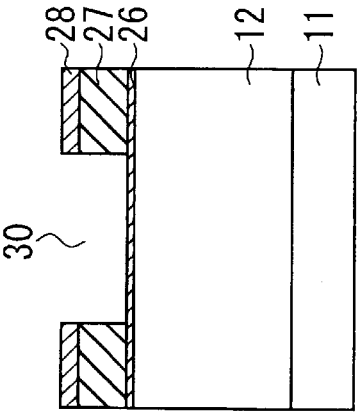
FIGS. 12(a) through 12(c) are cross-sectional views illustrative of a step of fabricating the field-effect transistor according to the present invention.
Figure 11:
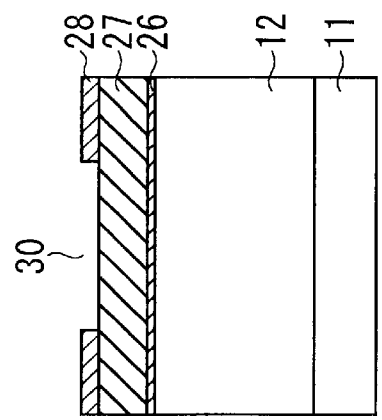
Figure 12:
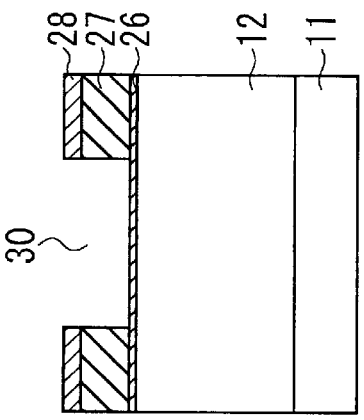
Figure 11:
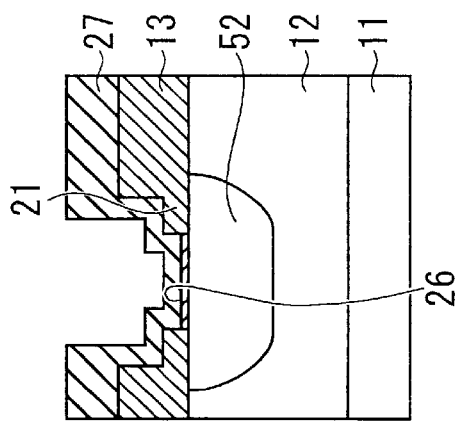
Figure 12:
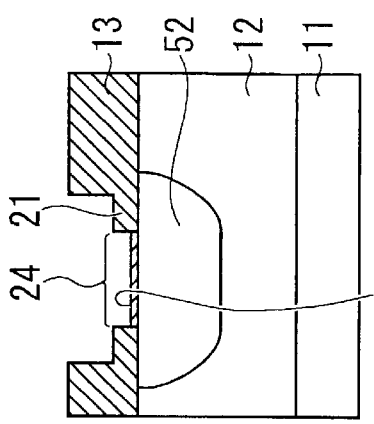

When the gate electrode film 27 is etched, the gate electrode film 27 at the bottom of the openings 30 is removed, exposing the gate insulating film 26 at the bottom of the openings 30 in the active region, as shown in FIGS. 12(*a*) and 12(*b*). In the peripheral region, the gate electrode film 27 is fully removed, exposing the surfaces of the silicon oxide films 13, 21 and the surface of the gate insulating film 26, as shown in FIG. 12(*c*).

The etching of the gate electrode film 27 creates an opening 33, which is identical in shape to the opening 30 in the resist film 28 in the active region, and then the resist film 28 is removed. The surface of the gate insulating film 26 is exposed at the bottom of the opening 33 in the active region, as shown in FIGS. 13(*a*) and 13(*b*). In the peripheral region, the surface of the silicon oxide film 13, the surface of the silicon oxide film 21 having the opening 24, and the surface of the gate insulating film 26 formed in the opening 24 are exposed, as shown in FIG. 13(*c*).

Figure 26:
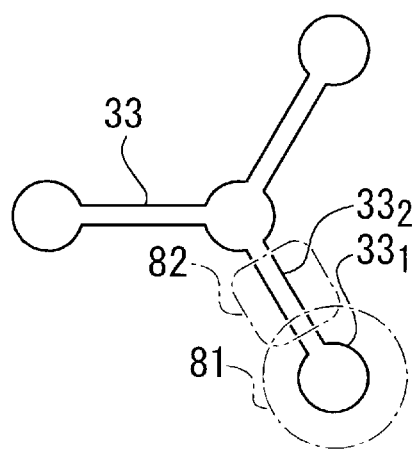
FIGS. 26(a) through 26(d) are plan views illustrative of steps of fabricating a cell in the field-effect transistor according to the present invention.
Figure 26:
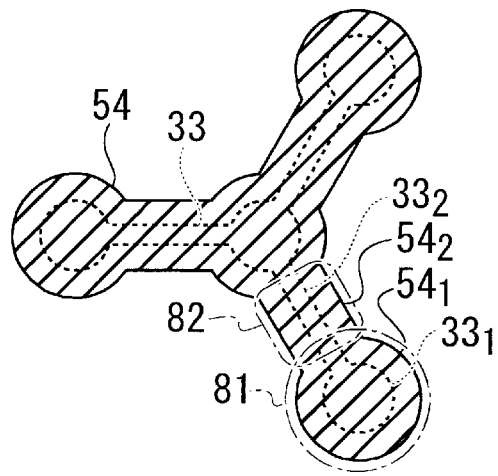
Figure 26:
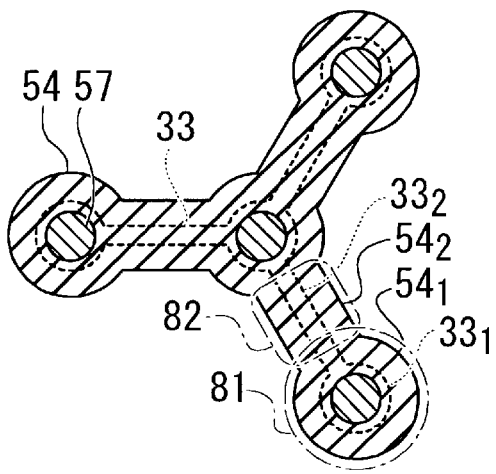
Figure 26:
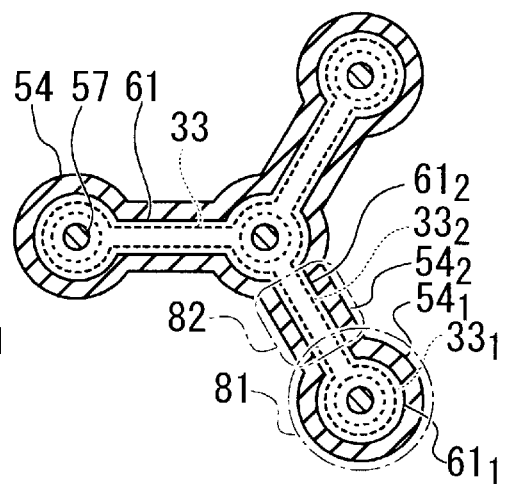

The opening 33 defined in the gate electrode film 27 in the active region is shown in plan in FIG. 26(*a*). The opening 33 comprises circular portions 33$_1$ in the nodes 81 and rectangular portions 33$_2$ in the branches 82. The rectangular portions 33$_2$ are connected to the circular portions 33$_1$, making up the single opening 33.

When boron ions 32 are applied to the surface of the assembly, the boron ions 32 are injected into the surface of the drain layer 12 through the gate insulating film 26 exposed at the bottom of the opening 33 in the active region. The injected boron ions 32 produce a high-concentration region 53 near the surface of the drain layer 12, as shown in FIGS. 13(*a*) and 13(*b*).

Since the boron ions 32 cannot pass through the gate electrode film 27, the high-concentration region 53 is identical in shape to the opening 33 as viewed in plan.

In the peripheral region, the boron ions 32 that have passed through the gate insulating film 26 are introduced into the well region 52, forming a high-concentration region 53 near the surface of the well region 52, as shown in FIG. 13(*c*). In the peripheral region, the boron ions 32 cannot pass through the silicon oxide films 13, 21, and hence the high-concentration region 53 is identical in shape to the opening 24 as viewed in plan.

When the high-concentration region 53 is thermally diffused, a p-type base region 54 is formed in the n-type drain layer 12 in the active region, as shown in FIGS. 14(*a*) and 14(*b*). In the peripheral region, a p-type base region 54 is formed in the p-type well region 52, as shown in FIG. 14(*c*).

The base region 54 of the cell 1 is similar in shape to the opening 33 defined in the gate electrode film 27. The base region 54 is of a circular shape in the nodes and of a rectangular shape in the branches. The circular portions of the base region 54 in the nodes are connected to respective opposite ends of the rectangular portions of the base region 54 in the branches. A single cell 1 contains a single base region 54.

The base region 54 of the cell 1 is shown in plan in FIG. 26(*b*). The base region 54 has an outer periphery diffused laterally outwardly of the outer periphery of the opening 33, and hence has a size greater than the opening 33.

In the peripheral region, the silicon oxide films 13, 21 and the gate oxide film 26 are exposed, as shown in FIG. 15(*c*). In the active region, a patterned resist film 34 is provided, as shown in FIGS. 15(*a*) and 15(*b*).

The gate insulating film 26 in the branches is fully covered with the resist film 34, as shown in FIG. 15(*b*), and an opening 36 defined in the resist film 34 is positioned centrally in the gate insulating film 26 in the nodes, as shown in FIG. 15(*a*).

The opening 36 is circular in shape, and the gate insulating film 26 on the base region 54 in the nodes has a central portion whose surface is exposed at the bottom of the opening 36.

When boron ions 35 are applied to the surface of the assembly, the boron ions 35 are injected into the base region 54 in the nodes and the peripheral region through the gate insulating film 26, producing a high-concentration region 56, as shown in FIGS. 15(*a*) and 15(*c*). No boron ions are injected into the base region 54 in the branches, and hence no high-concentration region 56 is formed therein, as shown in FIG. 15(*b*).

After the resist film 34 is removed, the assembly is heated to diffuse the high-concentration region 56 into a p$^+$-type ohmic region 57 in the nodes and the peripheral region, as shown in FIGS. 16(*a*) and 16(*c*). No ohmic region is formed in the branches, as shown in FIG. 16(*b*).

The base region 54 and the ohmic region 57 of the cell 1 are shown in plan in FIG. 26(*c*). The ohmic region 57 is of a circular shape, and disposed radially inwardly of the outer periphery of the base region 54 in the nodes. The ohmic region 57 is shallower than the base region 54. No ohmic region 57 is formed in the branches.

Figure 17A:
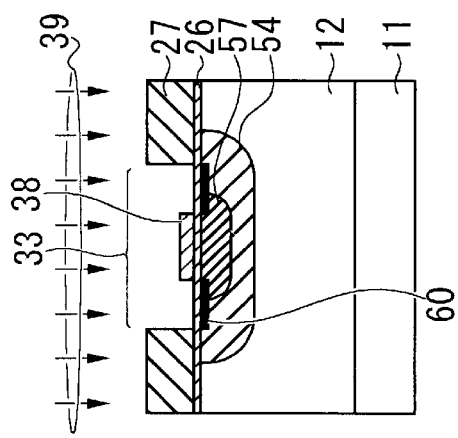
FIGS. 17(a) through 17(c) are cross-sectional views illustrative of a step of fabricating the field-effect transistor according to the present invention.
Figure 17B:
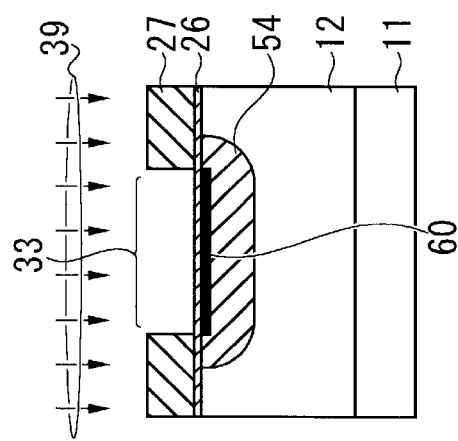
Figure 17C:
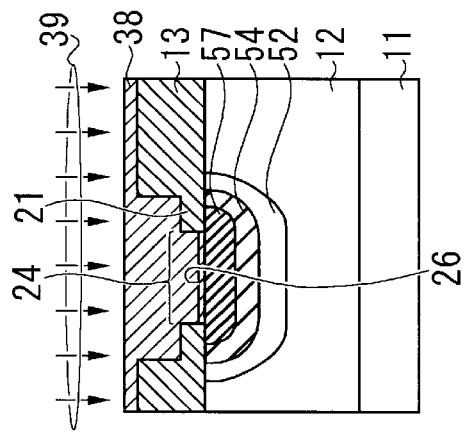

After the formation of the ohmic region 57, a patterned resist film 38 is formed on the surface of the assembly as shown in FIGS. 17(*a*)–17(*c*). In the nodes in the active region, the resist film 38 is disposed on the gate insulating film 26 at the center of the ohmic region 57, as shown in FIG. 17(*a*). The gate insulating film 26 is exposed around the resist film 38.

No resist film 38 is formed in the branches in the active region, with the gate insulating film 26 exposed therein, a shown in FIG. 17(*b*). In the peripheral region, the surface of the gate insulating film 26 is covered with the resist film 38, as shown in FIG. 17(*c*).

When arsenic ions 39 are applied, the gate electrode film 27 and the resist film 38 act as a mask in the nodes in the active region. The arsenic ions 39 that have passed through the gate insulating film 26 are introduced into a peripheral portion of the base region 54 and an outer peripheral portion of the ohmic region 57, forming a high-concentration region 60 of arsenic, as shown in FIG. 17(*a*).

In the branches in the active region, the arsenic ions 39 are introduced according to the pattern of the opening 33 in the gate electrode film 27, forming a high-concentration region 60 of arsenic in the base region 54, as shown in FIG. 17(*b*). In the peripheral region, no arsenic ions 39 are introduced because the assembly is covered with the resist film 38, as shown in FIG. 17(*c*).

Figure 18A:
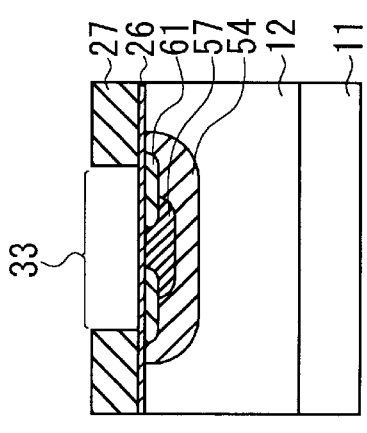
FIGS. 18(a) through 18(c) are cross-sectional views illustrative of a step of fabricating the field-effect transistor according to the present invention.
Figure 18B:
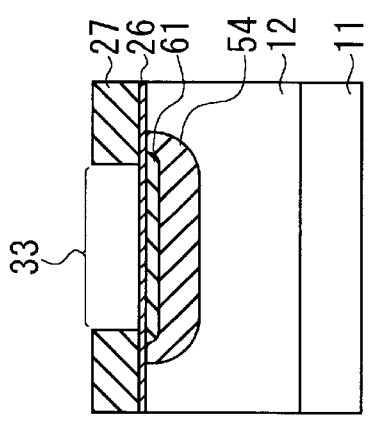

Subsequent to the removal of the resist film 38, the assembly is heated to diffuse the arsenic in the high-concentration region 60. As a result, a source region 61 is formed in the nodes and branches in the active region, as shown in FIGS. 18(*a*) and 18(*b*), and no source region 61 is formed in the peripheral region, as shown in FIG. 18(*c*).

The source region 61 is shown in plan in FIG. 26(*d*). The source region 61 is of a ring shape 61$_1$ in the nodes 81 in the active region, with the ohmic region 57 remaining on the surface at the center of the ring shape 61$_1$. In the branches 82, the source region 61 is of a rectangular shape 61$_2$.

The ring-shaped portion 61$_1$ and the rectangular portion 61$_2$ are connected to each other, making up the single source region 61. The source region 61 has an outer periphery disposed radially inwardly of the outer periphery of the base region 54.

The outer periphery of the source region 61 and the outer periphery of the base region 54 are diffused beyond the edge of the opening 33 in the gate electrode film 27 by the lateral diffusion of arsenic, and positioned underneath the gate electrode film 27.

The outer periphery of the base region 54 and the outer periphery of the source region 61 are spaced from each other by a certain distance, and the portion of the base region 54 lying therebetween serves as a channel region. In the MOS transistor 5, when the source region 61 is placed at the ground potential and a positive voltage higher than a threshold voltage is applied to the gate insulating film 26, the surface of the base region 54 in the channel region is inverted into an n-type layer, which connects the source region 61 and the drain layer 12 to each other.

In the active region, the base region 54, the ohmic region 57, and the source region 61 jointly make up the cell 1.

Figure 18C:
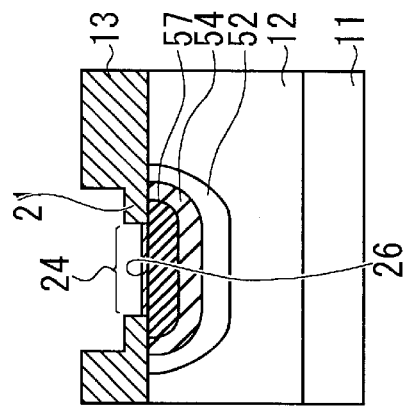
Figure 21:
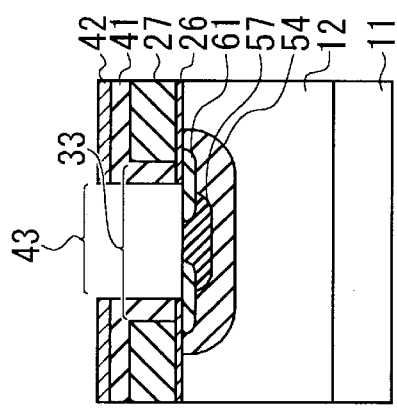
FIGS. 21(a) through 21(c) are cross-sectional views illustrative of a step of fabricating the field-effect transistor according to the present invention.
Figure 21:
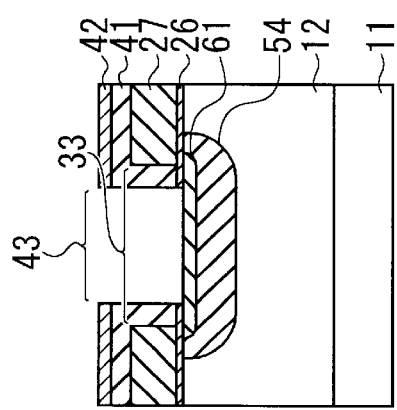
Figure 21:
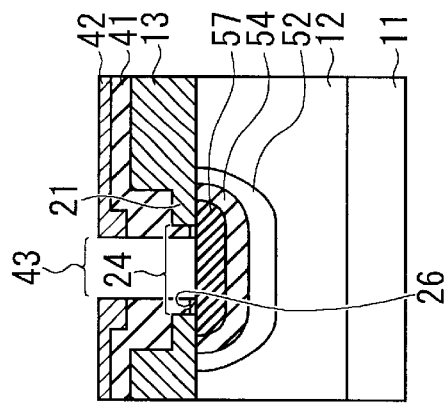
Figure 22:
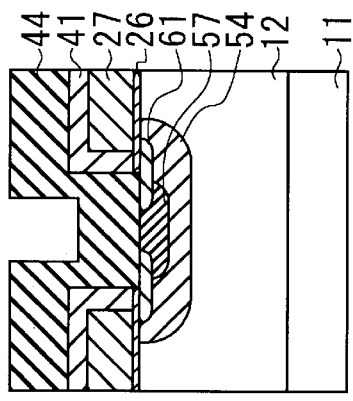
FIGS. 22(a) through 22(c) are cross-sectional views illustrative of a step of fabricating the field-effect transistor according to the present invention.
Figure 22:
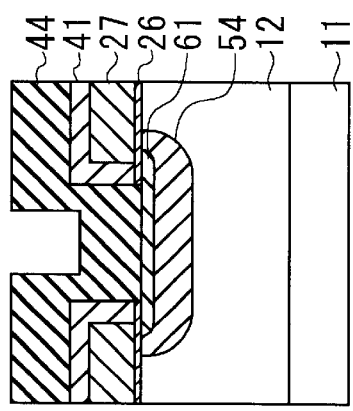
Figure 22:
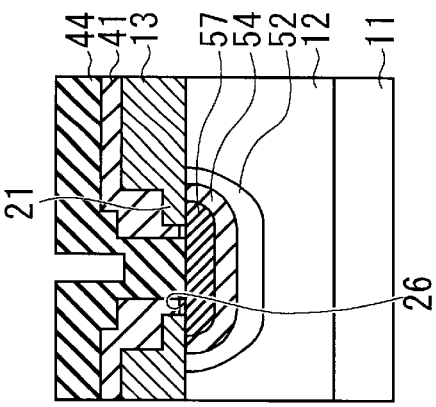
Figure 23:
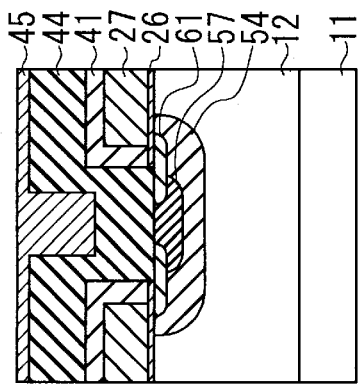
FIGS. 23(a) through 23(c) are cross-sectional views illustrative of a step of fabricating the field-effect transistor according to the present invention.
Figure 23:
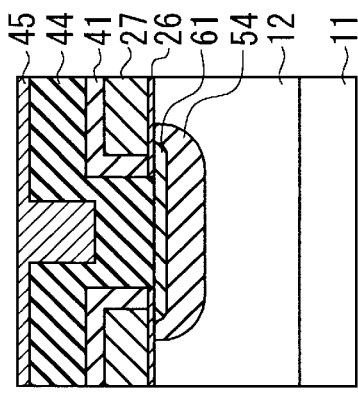
Figure 23:
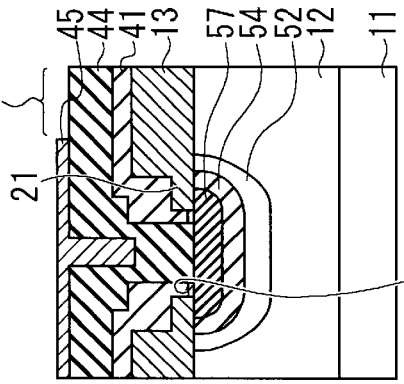
Figure 24:
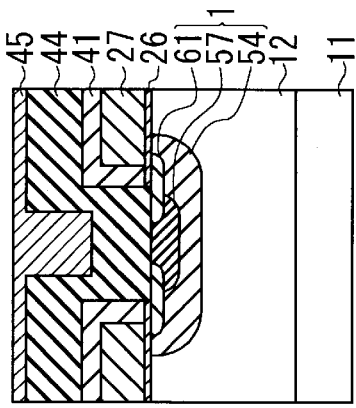
FIGS. 24(a) through 24(c) are cross-sectional views illustrative of a step of fabricating the field-effect transistor according to the present invention.
Figure 24:
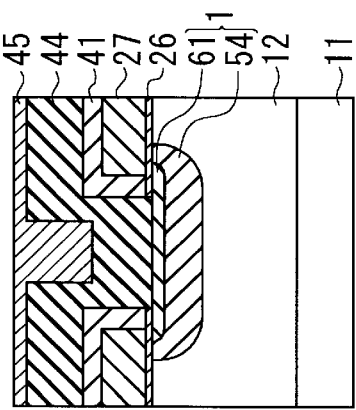
Figure 24:
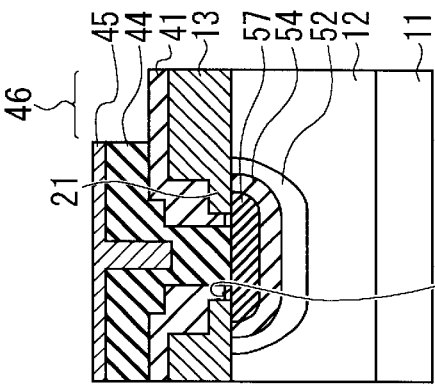

In the peripheral region, no high-concentration layer 60 of arsenic is formed, and hence no source region 61 is formed, as shown in FIG. 18(c).

Then, an inter-layer insulating film 41 is deposited on the entire surface of the assembly, as shown in FIGS. 19(a)–19 (c), and then a patterned resist film 42 is deposited on the surface of the inter-layer insulating film 41, as shown in FIGS. 20(a)–20(c).

In FIGS. 20(a)–20(c), the resist film 42 has an opening 43 through which the inter-layer insulating film 41 is exposed.

In the active region, the opening 43 is similar in shape to the opening 33 in the gate electrode film 27, and is positioned within the opening 33. In the peripheral region, the opening 43 is ring-shaped, and has an inner peripheral edge positioned radially outwardly of an inner peripheral edge of the ring-shaped ohmic region 57 and an outer peripheral edge positioned radially inwardly of an outer peripheral edge of the ring-shaped ohmic region 57.

When the inter-layer insulating film 41 exposed at the bottom of the opening 43 is etched using the resist film 42 as a mask, the surface of the central portion of the ohmic region 57 and the surface of the inner portion of the ring-shaped source region 61 are exposed at the bottom of the opening 43 in the nodes, as shown in FIG. 21(a), and the source region 61 is exposed except its outer periphery, as shown in FIG. 21(b). In the peripheral region, the surface of the ring-shaped ohmic region 57 is exposed in a ring pattern, as shown in FIG. 21(c).

After the resist film 42 is removed, a source electrode film 44 comprising a thin aluminum film is deposited on the entire surface of the assembly. In the active region, the source region 61 and the ohmic region 57 are connected to the source electrode film 44, as shown in FIGS. 22(a) and 22(b). In the peripheral region, the ohmic region 57 is connected to the source electrode film 44, as shown in FIG. 22(c).

Then, a patterned resist film 45 is deposited on the surface of the source electrode film 44, as shown in FIGS. 23(a) –23(c). In the active region, the surface of the source electrode film 44 is covered with the resist film 45. An opening 46 is defined in the resist film 45 at a position in the peripheral region where the well region 52 is located adjacent to the active region, and the source electrode film 44 is exposed at the bottom of the opening 46.

When the assembly is etched, the source electrode film 44 exposed at the bottom of the opening 46 is removed, exposing the inter-layer insulating film 41 at the bottom of the opening 46, as shown in FIG. 24(c). In the active region, the source electrode film 44 is not etched away, as shown in FIGS. 24(a) and 24(b).

Figure 25A:
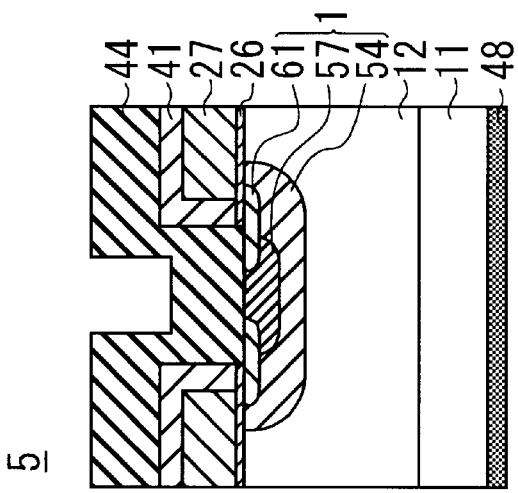
FIGS. 25(a) through 25(c) are cross-sectional views illustrative of a step of fabricating the field-effect transistor according to the present invention.
Figure 25B:
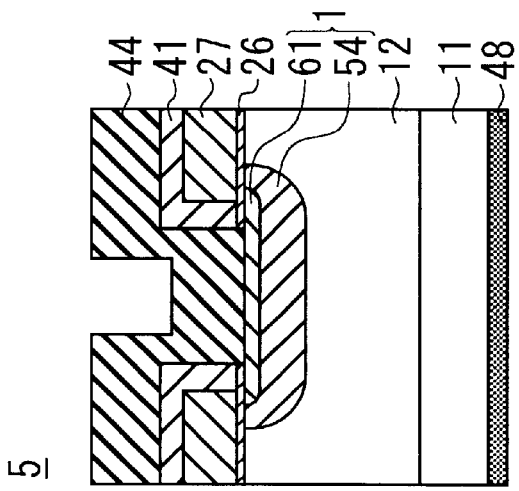
Figure 25C:
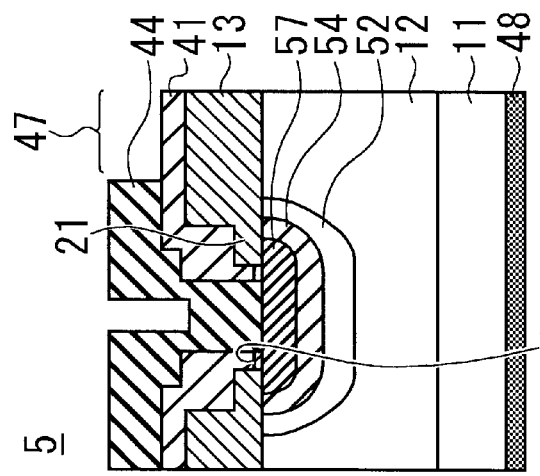

When the resist film 45 is removed, the source electrode film 44 in the active region and the source electrode film 44 in the peripheral region are separated from each other by a groove 47 defined in the source electrode film 44 and having the same shape as the opening 46, as shown in FIG. 25(c).

The source electrode pad 71 is formed of the thin aluminum film as the source electrode film 44. The source electrode film 44 in the active region is connected to the source electrode pad 71.

The thin aluminum film as the source electrode film 44 is disposed on the surface of the gate electrode film 27 which is partly exposed. The thin aluminum film on the gate electrode film 27 is electrically separate from the source electrode film 44 connected to the source electrode pad 71. The gate electrode film 27 and the thin aluminum film on the surface thereof jointly make up the gate electrode pad 72.

Subsequent to the removal of the resist film 45, a passivation film (not shown) is deposited with the source electrode pad 71 and the gate electrode pad 72 exposed, and the drain electrode film 48 is deposited on the reverse side of the assembly, whereupon the MOS transistor 5 is completed, as shown in FIGS. 25(a)–25(c).

The cell 1 of the MOS transistor 5 according to the present invention is fabricated according to the fabrication process described above.

The drain layer 12 may have a thickness ranging from $6 \times 10^{-6}$ m–$10 \times 10^{-6}$ m for low withstand voltages, and a greater thickness up to about $60 \times 10^{-6}$ m for high withstand voltages. As shown in FIG. 31, the cell 1 typically has such a size that, in the nodes 81, the base region 54 has a radius $R_1$ of about $4 \times 10^{-6}$ m and a depth $D_1$ of about $1.5 \times 10^{-6}$ m, the source region 61 has an outer radius $R_2$ of about $3 \times 10^{-6}$ m and a depth $D_2$ of about $0.3 \times 10^{-6}$ m, the ohmic region 57 has a radius $R_3$ of about $2 \times 10^{-6}$ m and a depth $D_3$ of about $1 \times 10^{-6}$ m. The reference numeral 55 in FIG. 31 indicated the periphery of the ohmic region 57. The source region 61 has an inner radius $R_4$ of about $1 \times 10^{-6}$ m.

As shown in FIG. 29, the cells 1 are uniformly arranged at predetermined spaced intervals. The centers of adjacent ones of the nodes 81 are spaced from each other by substantially equal distances S which are in the range from $6 \times 10^{-6}$ m to $20 \times 10^{-6}$ m, typically from $8 \times 10^{-6}$ m to $9 \times 10^{-6}$ m.

The uniformly arranged cells 1 are arrayed in vertical columns, and the cells 1 in each of the vertical columns are oriented in one direction, making up a cell group. A central cell group 76 has a central axis $L_1$ and is horizontally symmetrical with respect to the central axis $L_1$.

The central cell group 76 has a cell $1_a$, In the cell $1_a$, two straight lines $L_2$, $L_3$ which interconnect the nodes that are not positioned on the central axis $L_1$ and the central node, and the central axis $L_1$ intersect with each other at 120°.

The cells of the central cell group 76 and the cells of cell groups $76_L$, $76_R$ adjacent to the central cell group 76 are oriented in opposite directions.

The straight lines $L_2$, $L_3$ extending through the cell $1_a$ pass through the centers of nodes of cells of the adjacent cell groups $76_L$, $76_R$, and those nodes are spaced from adjacent branches of the cell $1_a$ by substantially equal distances T.

In the central cell group 76, cells $1_b$, $1_c$ positioned above and below the cell $1_a$ have branches and nodes directed toward nodes and branches of the cell $1_a$ and spaced therefrom by the distances T.

Straight lines $M_1$–$M_3$ passing through the centers of the nodes of the cell $1_a$ and extending perpendicularly to the central axis $L_1$ pass through the centers of nodes of cells in the adjacent cell groups $76_L$, $76_R$.

Therefore, the cells 1 are uniformly arranged in the drain layer 12. Because the nodes of each of the cells 1 are connected by the branches, the base region 54 and the source region 61 have increased peripheral lengths, resulting in a low conduction resistance.

The gate electrode film 27 is disposed on the drain layer 12 positioned between adjacent two of the cells 1 and connected to the gate electrode film 27 on the channel region of each of the cells. Therefore, currents for charging and discharging the gate electrode film 27 can flow in various directions, so that the equivalent resistance of the gate electrode film 27 is small.

In the above embodiment, each cell 1 has three branches extending radially outwardly from the central node. However, the present invention is not limited to the MOS transistor which has the above cells 1.

Figure 32:
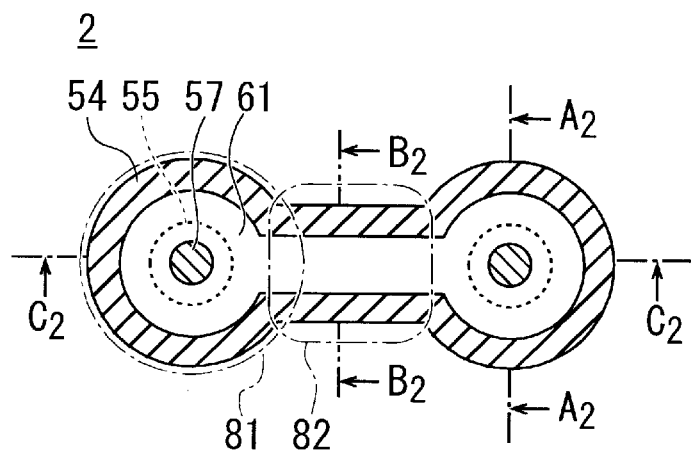
FIG. 32(a) is a plan view of another cell for use in the field-effect transistor according to the present invention.
FIG. 32(b) is a plan view showing a layout of the cells shown in FIG. 32(a)
Figure 32:
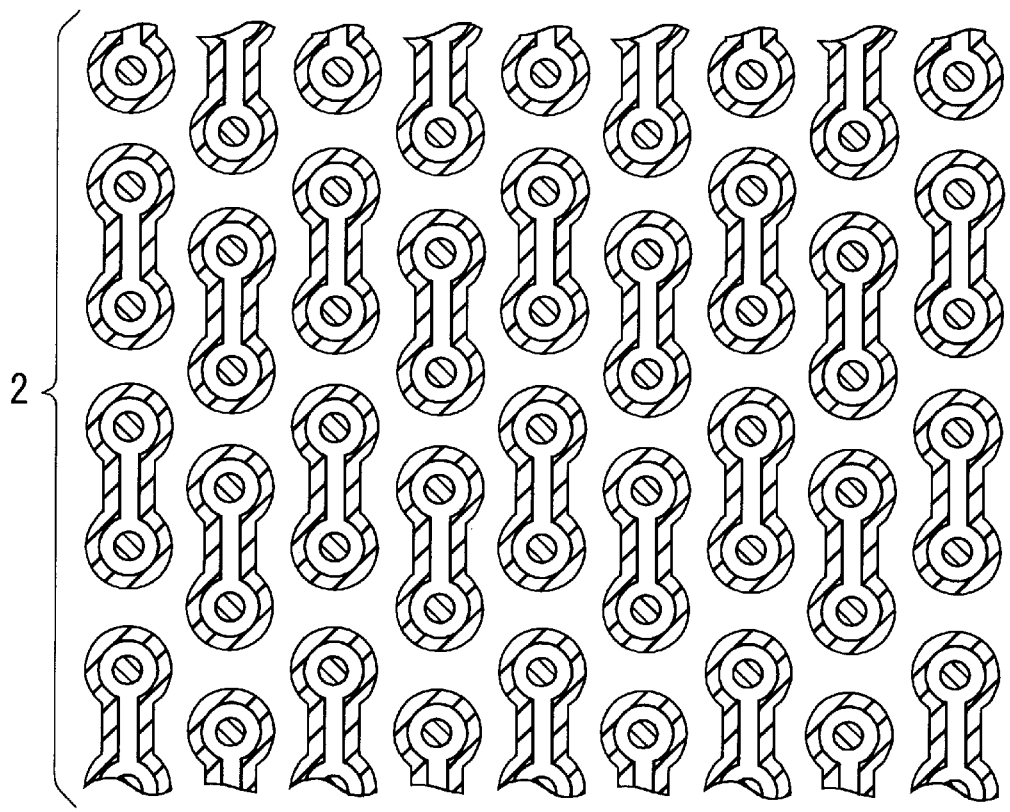

FIGS. 32(a) and 32(b) show a cell 2 having one branch 82 and two nodes 81 which are positioned at respective opposite ends of the branch 82. The base region 54 in the nodes 81 and the base region 54 in the branch 82 are connected to each other. Similarly, the source region 61 in the nodes 81 and the source region 61 in the branch 82 are connected to each other.

The cell 2 has the single base region 54 and the single source region 61 which is similar in shape to the base region 54 and disposed in the base region 54. The outer periphery of the source region 61 is spaced a certain distance from the outer periphery of the base region 54.

A cross-sectional view of the node 81 of the cell 2, which is taken along line $A_2$—$A_2$, is the same as the cross-sectional view of the node 81 of the cell 1, which is taken along line $A_1$—$A_1$. A cross-sectional view of the branch 82 of the cell 2, which is taken along line $B_2$—$B_2$, is the same as the cross-sectional view of the branch 82 of the cell 1, which is taken along line $B_1$—$B_1$, and a cross-sectional view of the node 81 and branch 82 of the cell 2, which is taken along line $C_2$—$C_2$, is the same as the cross-sectional view of the node 81 and branch 82 of the cell 1, which is taken along line $C_1$—$C_1$.

The cells 2 are uniformly arranged in a regular pattern in the drain layer 12, and the centers of the nodes 81 of the cells 2 are spaced by equal distances.

The cells 2 are arranged in a tessellated pattern such that the nodes 81 and the branch 82 of adjacent two of the cells 2 confront each other, and are uniformly arranged such that the distances between the nodes 81 and the branches 82 of the cells 2 are equal to each other.

Figure 33:
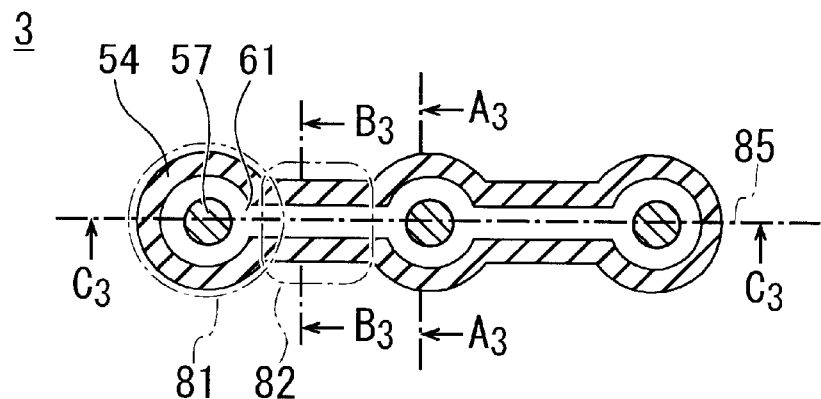
FIG. 33(a) is a plan view of still another cell for use in the field-effect transistor according to the present invention.
FIG. 33(b) is a plan view showing a layout of the cells shown in FIG. 33(a)
Figure 33:
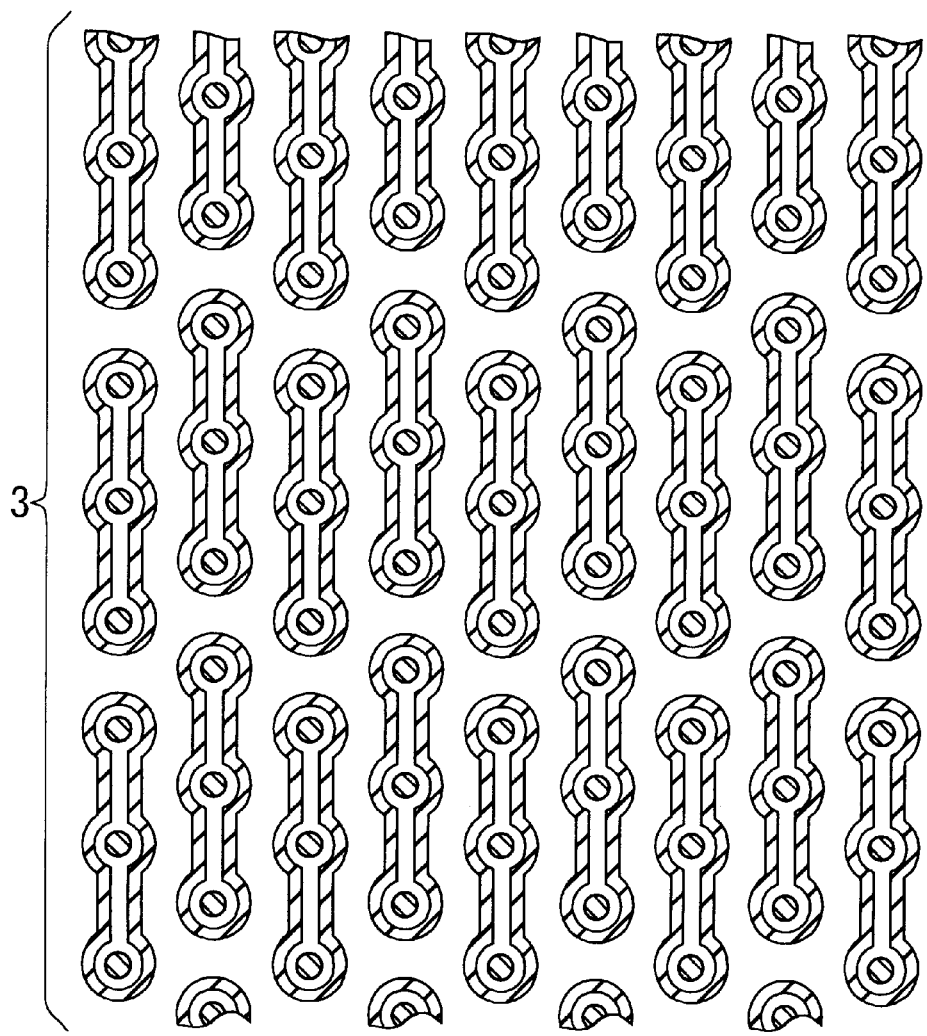

FIGS. 33(a) and 33(b) show a cell 3 having three nodes 81 and two branches 82. The nodes 81 are arranged at equal spaced intervals, with the branches 82 disposed between the nodes 81.

In the cell 3, the nodes 81 and the branches 82 are positioned on a single axial line 85, and arranged symmetrically with respect to the axial line 85.

A cross-sectional view of the node 81 of the cell 3, which is taken along line $A_3$—$A_3$, is the same as the cross-sectional view of the node 81 of the cell 1, which is taken along line $A_1$—$A_1$. A cross-sectional view of the branch 82 of the cell 3, which is taken along line $B_3$—$B_3$, is the same as the cross-sectional view of the branch 82 of the cell 1, which is taken along line $B_1$—$B_1$, and a cross-sectional view of the node 81 and branch 82 of the cell 3, which is taken along line $C_3$—$C_3$, is the same as the cross-sectional view of the node 81 and branch 82 of the cell 1, which is taken along line $C_1$—$C_1$.

FIG. 28 shows another MOS transistor 5' according to the present invention. The MOS transistor 5' differs from the MOS transistor 5 in that it has an n-type channel stopper 66 disposed on an outer peripheral edge thereof. The channel stopper 66 is formed together with the source region 61 and disposed as a ring around the outer periphery of the chip of the MOS transistor 5'. The channel stopper 66 serves to prevent a leakage current due to the formation of an inverted layer on the surface of the drain layer 12 in the peripheral region.

Figure 34:
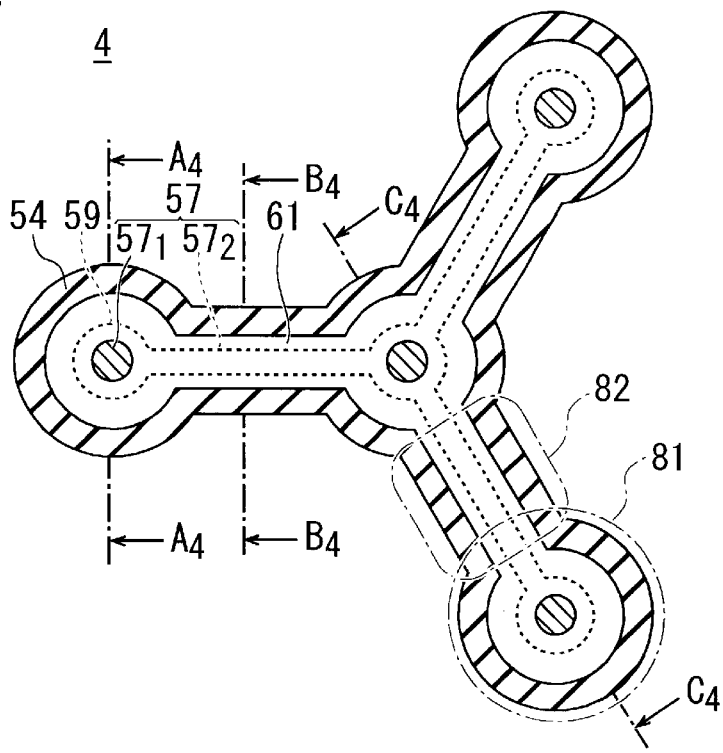
FIG. 34 is a plan view of example 4 of a cell for use in the field-effect transistor according to the present invention.

Referring to an another structure of cell for the present invention, FIG. 34 shows cells 4 having a plan pattern identical to cells 1 in FIG. 30. In FIG. 34, those parts of the cells 4 are denoted by identical reference numerals. The ohmic region 57 comprises ohmic region $57_1$ positioned in the nodes 81 and ohmic region $57_2$ positioned in the branches 82 in the cells 4 shown in FIG. 34.

Figure 35:
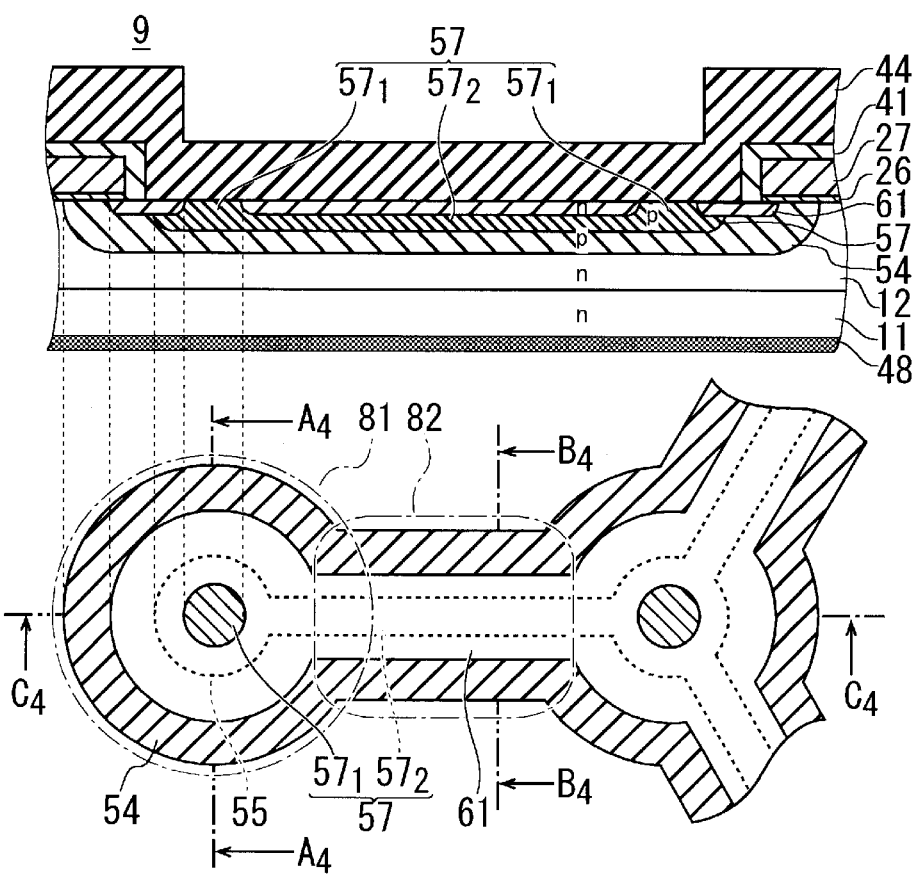
FIG. 35 is set of a cross-sectional view of the example 4 of cell for use in the field-effect transistor according to the present invention, and a plan view corresponding to the cross-sectional view.

FIGS. 36(a) through 36(c) are illustrative of diffused ohmic region $57_1$ and $57_2$ in the step of the process of fabricating the calls 4. The ohmic region $57_1$ and $57_2$ are diffused same condition as FIG. 16 of cells 1 in FIG. 30. FIGS. 37(a) through 37(c) correspond to FIGS. 25(a) through(c) of cells 1 in FIG. 30. FIG. 37(a) is cross-sectional view taken along line $A_4$—$A_4$ of FIG. 34. FIG. 37(b) is cross-sectional view taken along line $B_4$—$B_4$ of FIG. 34. FIG. 37(c) is cross-sectional view of the peripheral region. FIG. 35 shows cross-sectional view taken along line C4—C4 of cells 4 of FIG. 34 and enlarged partial plan view of cells 4.

Referring to FIGS. 34, 35 and 37, the ohmic region $57_1$ in the nodes 81 is circular-shaped in plan view, identical to the cell 1 of FIG. 30. In the nodes 81, central portion of the ohmic region $57_1$ is exposed centrally in the source region 61. The source electrode film 44 is formed on the surface of the ohmic region $57_1$ and the surface of the source region 61.

In the branches 82, the ohmic region $57_2$ is rectangular-shaped in plan view, identical to the cell 1 of FIG. 30. The both end of the ohmic region $57_2$ are connected to the ohmic region $57_1$ in the nodes 81 by superposed thereof. The surface of ohmic region $57_2$ is not exposed in the branches 82. In the branches 82, the ohmic region $57_2$ is positioned underneath the source region 61.

In the MOS transistor having the cells 4 described above, the concentration of an p-type impurity in the adjoining portion of the bottom of n-type source region 61 is higher than MOS transistor 5 having the cells 1 shown in FIG. 30. Therefore, the conduction resistance of p-type diffused layer is low at the portion of high concentration impurity.

A p-n junction between the base region 54 and the drain layer 12 is applied forward bias voltage, minority career is injected into the drain layer 12. Then the p-n junction is applied reverse bias voltage, the minority career is injected into base region 54 in the branches 82 from the drain layer 12. The minority career reach the ohmic region $57_1$ in the nodes 81 through the ohmic region $57_2$ underneath the source region 61 in the branches 82, and then the minority career is ingected into the source electrode 44.

When the minority career flow into cells 4 form the drain layer 12, the conductive resistance of p-type diffused layer of underneath the source region 61 is lower than the cells 1 of FIG. 30.

Therefore, a broken strength of the MOS transistor 9 having the cells 4 is higher than the cells 1 of FIG. 30.

In the above embodiments, the n-type drain layer 12 is formed on the n-type substrate 11, and the p-type base region 54 and ohmic layer 57, and the n-type source region 61 make up the n-channel cells 1–4. However, a p-type drain layer may be disposed on a p-type substrate, and an n-type base region and ohmic layer, and a p-type source region may make up p-channel cells.

The field-effect transistors having the cells 1–4 described above are not limited to the MOS transistor 5.

Figure 38:
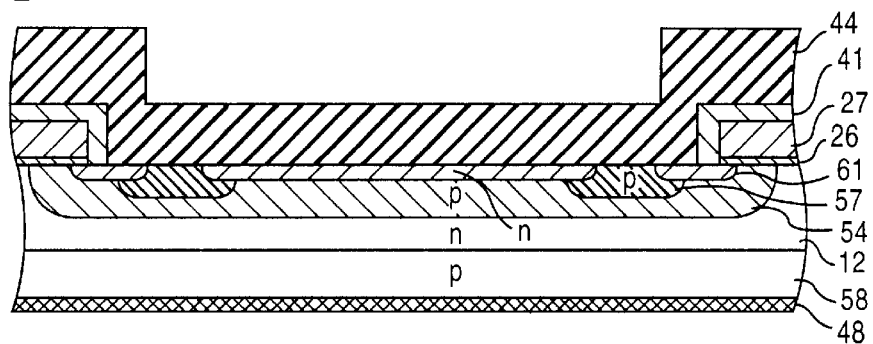
FIG. 38 is a cross-sectional view of an IGBT as an example of the field-effect transistor according to the present invention.

FIG. 38 shows an IGBT 6 having a field-effect transistor according to the present invention. Those parts of the IGBT 6 which are identical to those of the MOS transistor 5 are denoted by identical reference numerals. The IGBT 6 is a structure identical to the MOS transistor 5 except that the n-type substrate of the MOS transistor 5 is replaced with a p-type substrate 58. The n-type drain layer 12 is formed on the p-type substrate 58. When the surface of the channel region in the cells 1–4 is inverted and a current flows between the drain layer 12 and the source region 61, a minority carrier is injected from the substrate 58 into the drain layer 12, lowering the conduction resistance of the drain layer 12.

If the n-type substrate 11 of the MOS transistor 5 comprises a substrate of single-crystal silicon having a low impurity concentration and is ground to a reduced thickness prior to the formation of the drain electrode film 48, and a Schottky junction is formed between the drain electrode film 48 and the substrate 11, then a minority carrier can be injected from the drain electrode film 48 into the substrate 11 and the drain layer 12 for thereby reducing the resistance of the drain layer 12.

Figure 39:
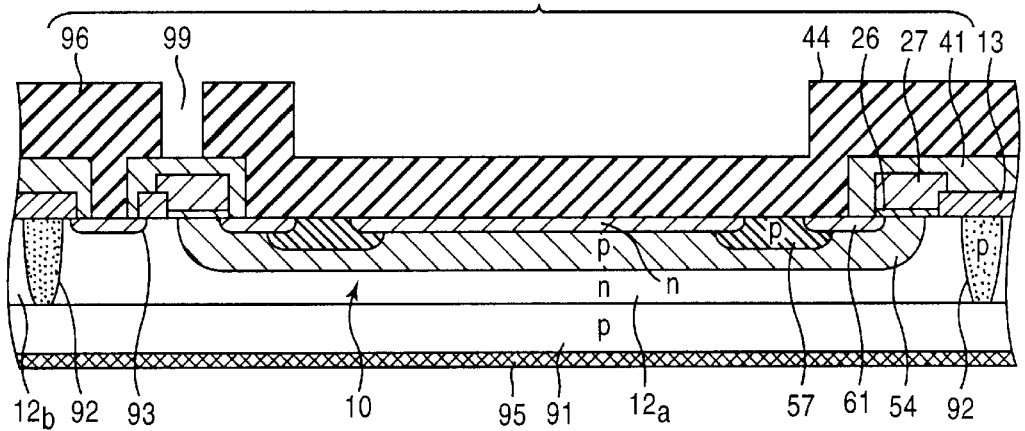
FIG. 39 is a cross-sectional view of an integrated circuit device having the field-effect transistor according to the present invention.
Figure 40:
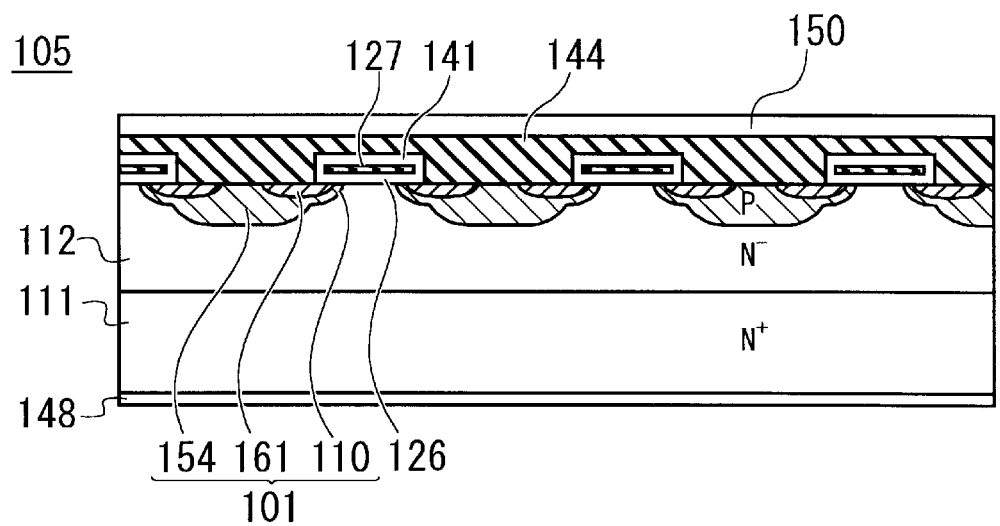
FIG. 40 is a cross-sectional view of a conventional field-effect transistor.
Figure 41:
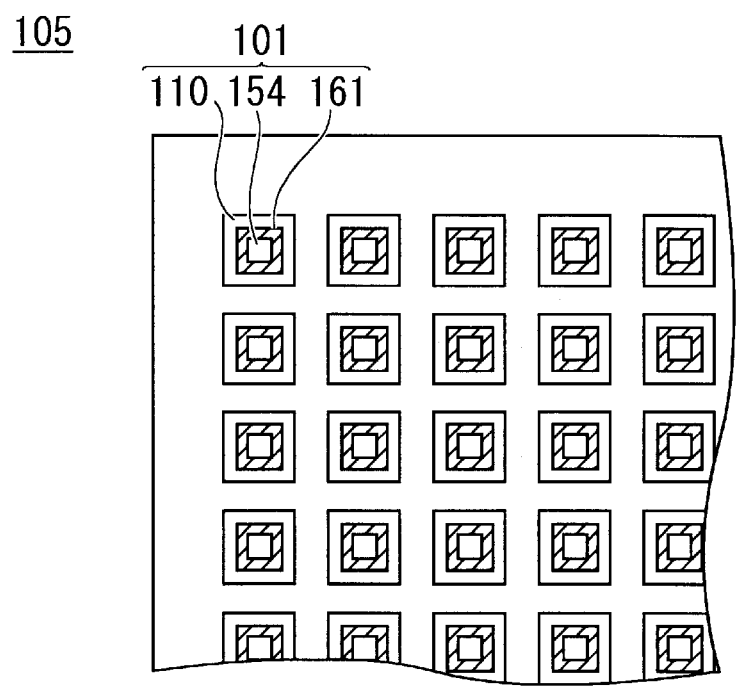
FIG. 41 is a plan view showing a layout of cells of the conventional field-effect transistor shown in FIG. 40.

FIG. 39 shows an integrated circuit device 7 having a field-effect transistor 8 according to the present invention. Those parts of the integrated circuit device 7 which are identical to those of the MOS transistor 5 are denoted by identical reference numerals. The integrated circuit device 7 has a p-type substrate 91 with the drain layer 12 in the form of an n-type epitaxial layer being disposed thereon. The drain layer 12 contains a plurality of cells 10 which are identical in plan pattern and cross-sectional structure to either one of the cells 1–4.

A p-type separating region 92 is formed around the area of the drain layer 12 where the cells 10 are positioned. The separating region 92 is of a ring-shaped pattern as viewed in plan, with at least one cell 10 disposed within the ring.

The separating region 92 has a bottom held in contact with the substrate 91. A drain layer 12a within the ring is separated from a drain layer 12b outside of the ring by a pn junction.

Electronic components including transistor components, diode components, resistance components, capacitor components, etc. are formed in the drain layer 12b outside of the ring, making up the integrated circuit device.

In addition to the cells 10, a drain region 93 formed simultaneously with the source region 61 is disposed in the drain layer 12a within the ring. A drain electrode film 96 which comprises the same thin aluminum film as the source electrode film 44 is disposed on the drain region 93. The drain electrode film 96 and the source electrode film 44 are separated from each other by a groove 99. The MOS transistor 8 where a drain current flows in the surface, which is the same side as the source electrode film 44, rather than in the reverse side of the substrate 91, is formed inside of the separating region 92.

The source electrode film 44 and the drain electrode film 96 are connected respectively to a source electrode pad and a drain electrode pad, and connected to external terminals by a connecting means (such as, wire bonding or the like).

The gate electrode film 27 is connected to a driver circuit within the integrated circuit device 7 for controlling operation of the MOS transistor 8.

With the integrated circuit device 7, since the conduction resistance of the MOS transistor 8 formed therein is small and the input capacitance of the gate terminal is also small, the burden on the driver circuit may be small.

The field-effect transistor according to the present invention has high breakdown voltage and a reduced gate-to-drain capacitance.

The field-effect transistor according to the present invention has high breakdown voltage, because of the ohmic region in the branches having a conductivity type which is the same as a conductivity type of the base region is positioned underneath the source region and the ohmic region is connected to the source electrode film.

Although certain preferred embodiments of the present invention have been shown and described in detail, it should be understood that various changes and modifications may be made therein without departing from the scope of the appended claims.

What is claimed is:

1. A field-effect transistor comprising:
   a drain layer being disposed on a surface of substrate;
   a plurality of base regions having a conductivity type which is opposite to the conductivity type of said drain layer, said base regions being disposed in a surface of said drain layer in an active region;
   a source region having a conductivity type which is the same as the conductivity type of said drain layer, and at least one said source region being disposed in each of said base regions in surfaces thereof respectively;
   said base regions having respective outer peripheries spaced from outer peripheries of said source regions disposed respectively in said base regions;
   said base regions having portions positioned between the outer peripheries of said base regions and the outer peripheries of said source regions, said portions serving as channel regions, respectively;
   a gate insulating film disposed on a surface of each of said channel regions; and
   a gate electrode film disposed on a surface of said gate insulating film,
   the arrangement being such that when a voltage of a predetermined polarity is applied to said gate electrode film to invert the surface of each of said channel regions into a conductivity type opposite to said base regions, said source regions and said drain layer are connected to each other by the inverted surface of each of said channel regions;
   each of said base regions having three rectangular branches and four circular nodes,
   wherein said branches extend radially outwardly from a central one of said nodes, each of said branches being connected to said central node at the end of each said branches and being connected to the other nodes at the opposite end respectively,
   said source region in said branch and said source region in said nodes being connected to each other.

2. A field-effect transistor according to claim 1, wherein said rectangular branches are angularly spaced from each other at an angle of about 120° and connected to said central one of said nodes.

3. A filed-effect transistor according to claim 1, further comprising a substrate having a conductivity type which is the same as the conductivity type of said drain layer, said drain layer being disposed on said substrate, and an electrode on the substrate disposed on a side opposite of said drain layer.

4. A field-effect transistor according to claim 1, further comprising a substrate having a conductivity type which is opposite to the conductivity type of said drain layer, said drain layer being disposed on said substrate, and an electrode on the substrate disposed on a side opposite of said drain layer.

5. A field-effect transistor according to claim 1, further comprising an ohmic region disposed respectively within an inner periphery of each of said source region disposed in four nodes of said base region, said ohmic regions having a conductivity type which is the same as the conductivity type of said base regions and having a concentration higher than the concentration of said base regions, said ohmic regions and said source regions being connected to a source electrode film.

6. A field-effect transistor according to claim 5, wherein said rectangular branches are angularly spaced from each other at an angle of about 120° and connected to said central one of said nodes.

7. A field-effect transistor according to claim 5, further comprising a substrate having a conductivity type which is the same as the conductivity type of said drain layer, said drain layer being disposed on said substrate, and an electrode on the substrate disposed on a side opposite of said drain layer.

8. A field-effect transistor according to claim 5, further comprising a substrate having a conductivity type which is opposite to the conductivity type of said drain layer, said drain layer being disposed on said substrate, and an electrode on the substrate disposed on a side opposite of said drain layer.

9. A field-effect transistor according to claim 5, further comprising an ohmic region disposed respectively in said source region, said source region being disposed in each said branch of said base regions,
wherein said ohmic regions disposed in said nodes respectively are connected to each other via an ohmic region disposed in each of said branch, and
wherein surface of said source region disposed in each said base regions is exposed at the outer periphery of said connected ohmic region.

10. A field-effect transistor according to claim 5, wherein said source regions in said nodes have ring-shaped portions, said ohmic regions being disposed centrally in said ring-shaped.

11. A field-effect transistor according to claim 10, wherein said rectangular branches are angularly spaced from each other at an angle of about 120° and connected to said central one of said nodes.

12. A field-effect transistor according to claim 10, further comprising a substrate having a conductivity type which is the same as the conductivity type of said drain layer, said drain layer being disposed on said substrate, and an electrode on the substrate disposed on a side opposite of said drain layer.

13. A field-effect transistor according to claim 10, further comprising a substrate having a conductivity type which is opposite to the conductivity type of said drain layer, said drain layer being disposed on said substrate, and an electrode on the substrate disposed on a side opposite of said drain layer.

14. A field-effect transistor according to claim 10, wherein said ohmic regions of said branch being disposed underneath said source regions of said branch and connecting to said ohmic regions of said nodes.

15. A field-effect transistor according to claim 14, wherein said rectangular branches are angularly spaced from each other at an angle of about 120° and connected to said central one of said nodes.

16. A field-effect transistor according to claim 14, further comprising a substrate having a conductivity type which is the same as the conductivity type of said drain layer, said drain layer being disposed on said substrate, and an electrode on the substrate disposed on a side opposite of said drain layer.

17. A field-effect transistor according to claim 14, further comprising a substrate having a conductivity type which is opposite to the conductivity type of said drain layer, said drain layer being disposed on said substrate, and an electrode on the substrate disposed on a side opposite of said drain layer.

18. An integrated circuit device having a field-effect transistor, said field-effect transistor comprising:
a drain layer being disposed on a surface of substrate;
a plurality of base regions having a conductivity type which is opposite to the conductivity type of said drain layer, said base regions being disposed in a surface of said drain layer in an active region;
a source region having a conductivity type which is the same as the conductivity type of said drain layer, and at least one said source region being disposed in each of said base regions in surfaces thereof respectively;
said base regions having respective outer peripheries spaced from outer peripheries of said source regions disposed respectively in said base regions;
said base regions having portions positioned between the outer peripheries of said base regions and the outer peripheries of said source regions, said portions serving as channel regions, respectively;
a gate insulating film disposed on a surface of each of said channel regions; and
a gate electrode film disposed on a surface of said gate insulating film;
the arrangement being such that when a voltage of a predetermined polarity is applied to said gate electrode film to invert the surface of each of said channel regions into a conductivity type opposite to said base regions, said source regions and said drain layer are connected to each other by the inverted surface of each of said channel regions;
each of said base regions having at least one rectangular branch and at least two circular nodes;
the base region of said nodes having ends connected to opposite ends of the base region of said branch;
said source region in said branch and said source region in each of said nodes being connected to each other,
said integrated circuit further comprising:
a substrate having a conductivity type which is opposite to the conductivity type of said drain layer, said drain layer having an integrated circuit region having at least a transistor formed therein, a separating region surrounding said active region and having a conductivity type which is the opposite to the conductivity type of said drain layer, a pn junction separating electrically said active region from said integrated circuit region, and a drain electrode film being disposed in said surface of said drain layer in said active region, and said drain electrode film being separated electrically from said source region.

19. An integrated circuit device having a field-effect transistor, said field-effect transistor comprising:

a drain layer being disposed on a surface of substrate;

a plurality of base regions having a conductivity type which is opposite to the conductivity type of said drain layer, said base regions being disposed in a surface of said drain layer in an active region;

a source region having a conductivity type which is the same as the conductivity type of said drain layer, and at least one said source region being disposed in each of said base regions in surfaces thereof respectively;

said base regions having respective outer peripheries spaced from outer peripheries of said source regions disposed respectively in said base regions;

said base regions having portions positioned between the outer peripheries of said base regions and the outer peripheries of said source regions, said portions serving as channel regions, respectively;

a gate insulating film disposed on a surface of each of said channel regions; and a gate electrode film disposed on a surface of said gate insulating film, the arrangement being such that when a voltage of a predetermined polarity is applied to said gate electrode film to invert the surface of each of said channel regions into a conductivity type opposite to said base regions, said source regions and said drain layer are connected to each other by the inverted surface of each of said channel regions;

each of said base regions having at least one rectangular branch and at least two circular nodes;

the base region of said node having ends connected to opposite ends of the base region of said branch;

said source region in said branch and said source region in each of said nodes being connected to each other, a plurality of ohmic regions disposed respectively in said base regions, said ohmic regions having a conductivity type which is the same as the conductivity type of said base regions and having a concentration higher than the concentration of said base regions, said ohmic regions and said source regions being connected to a source electrode film, said integrated circuit further comprising:
a substrate having a conductivity type which is opposite to the conductivity type of said drain layer, said drain layer having an integrated circuit region having at least a transistor formed therein, a separating region surrounding said active region and having a conductivity type which is the opposite to the conductivity type of said drain layer, a pn junction separating electrically said active region from said integrated circuit region, and a drain electrode film being disposed in said surface of said drain layer in said active region, and said drain electrode film being separated electrically from said source region.

20. An integrated circuit device having a field-effect transistor, said field-effect transistor comprising:

a drain layer being disposed on a surface of substrate;

a plurality of base regions having a conductivity type which is opposite to the conductivity type of said drain layer, said base regions being disposed in a surface of said drain layer in an active region;

a source region having a conductivity type which is the same as the conductivity type of said drain layer, and at least one said source region being disposed in each of said base regions in surfaces thereof respectively;

said base regions having respective outer peripheries spaced from outer peripheries of said source regions disposed respectively in said base regions;

said base regions having portions positioned between the outer peripheries of said base regions and the outer peripheries of said source regions, said portions serving as channel regions, respectively;

a gate insulating film disposed on a surface of each of said channel regions; and a gate electrode film disposed on a surface of said gate insulating film, the arrangement being such that when a voltage of a predetermined polarity is applied to said gate electrode film to invert the surface of each of said channel regions into a conductivity type opposite to said base regions, said source regions and said drain layer are connected to each other by the inverted surface of each of said channel regions;

each of said base regions having at least one rectangular branch and at least two circular nodes;

the base region of said nodes having ends connected to opposite ends of the base region of said branch;

said source region in each of said branch and said source region in each of said nodes being connected to each other, said source regions in said nodes have ring-shaped portions, and an ohmic region being disposed centrally in each of said ring-shaped portion, said integrated circuit further comprising:
a substrate having a conductivity type which is opposite to the conductivity type of said drain layer, said drain layer having an integrated circuit region having at least a transistor formed therein, a separating region surrounding said active region and having a conductivity type which is the opposite to the conductivity type of said drain layer, a pn junction separating electrically said active region from said integrated circuit region, and a drain electrode film being disposed in surface of drain layer in said active region, and said drain electrode film being separated electrically from said source region.

21. An integrated circuit device having a field-effect transistor, said field-effect transistor comprising:

a drain layer being disposed on a surface of substrate;

a plurality of base regions having a conductivity type which is opposite to the conductivity type of said drain layer, said base regions being disposed in a surface of said drain layer in an active region;

a source region having a conductivity type which is the same as the conductivity type of said drain layer, and at least one said source region being disposed in each of said base regions in surfaces thereof respectively;

said base regions having respective outer peripheries spaced from outer peripheries of said source regions disposed respectively in said base regions;

said base regions having portions positioned between the outer peripheries of said base regions and the outer peripheries of said source regions, said portions serving as channel regions, respectively;

a gate insulating film disposed on a surface of each of said channel regions; and a gate electrode film disposed on a surface of said gate insulating film, the arrangement being such that when a voltage of a predetermined polarity is applied to said gate electrode film to invert the surface of each of said channel regions into a conductivity type opposite to said base regions, said source regions and said drain layer are connected to each other by the inverted surface of each of said channel regions;

each of said base regions having at least one rectangular branch and at least two circular nodes;

the base region of said nodes having ends connected to opposite ends of the base region of said branch;

said source region in each of said branch and said source region in each of said nodes being connected to each other, an ohmic region being disposed underneath said source regions in each of said branches and underneath said source regions in each of said nodes respectively, said ohmic regions in each of said branches and said ohmic regions in each of said nodes being connected to each other, said integrated circuit further comprising:

a substrate having a conductivity type which is opposite to the conductivity type of said drain layer, said drain layer having an integrated circuit region having at least a transistor formed therein, a separating region surrounding said active region and having a conductivity type which is the opposite to the conductivity type of said drain layer, a pn junction electrically separating said active region from said integrated circuit region, and a drain electrode film being disposed in said surface of said drain layer in said active region, and said drain electrode film being separated electrically from said source region.

* * * * *